(12) United States Patent
Yaglioglu

(10) Patent No.: US 11,774,467 B1
(45) Date of Patent: Oct. 3, 2023

(54) METHOD OF IN SITU MODULATION OF STRUCTURAL MATERIAL PROPERTIES AND/OR TEMPLATE SHAPE

(71) Applicant: Microfabrica Inc., Van Nuys, CA (US)

(72) Inventor: Onnik Yaglioglu, Chatsworth, CA (US)

(73) Assignee: MICROFABRICA INC., Van Nuys, CA (US)

( * ) Notice: Subject to any disclaimer, the term of this patent is extended or adjusted under 35 U.S.C. 154(b) by 87 days.

(21) Appl. No.: 17/464,644

(22) Filed: Sep. 1, 2021

Related U.S. Application Data

(60) Provisional application No. 63/075,081, filed on Sep. 4, 2020, provisional application No. 63/073,428, filed on Sep. 1, 2020.

(51) Int. Cl.
| | | |
|---|---|---|
| *G01R 1/073* | (2006.01) | |
| *C25D 1/10* | (2006.01) | |
| *G03F 7/20* | (2006.01) | |
| *G03F 7/00* | (2006.01) | |

(52) U.S. Cl.
CPC ............. *G01R 1/073* (2013.01); *C25D 1/10* (2013.01); *G03F 7/70025* (2013.01)

(58) Field of Classification Search
CPC ........ G01R 1/073; C25D 1/10; G03F 7/70025
See application file for complete search history.

(56) References Cited

U.S. PATENT DOCUMENTS

| | | |
|---|---|---|
| 4,027,935 A | 6/1977 | Byrnes et al. |
| 4,116,523 A | 9/1978 | Coberly et al. |
| 4,737,114 A | 4/1988 | Yaegashi |
| 4,773,877 A | 9/1988 | Kruger et al. |
| 4,821,411 A | 4/1989 | Yaegashi |
| 4,952,272 A | 8/1990 | Okino et al. |
| 5,177,438 A | 1/1993 | Littlebury et al. |
| 5,286,208 A | 2/1994 | Matsuoka |
| 5,321,685 A | 6/1994 | Nose et al. |
| 5,476,211 A | 12/1995 | Khandros |
| 5,513,430 A | 5/1996 | Yanof et al. |
| 5,599,194 A | 2/1997 | Ozawa et al. |

(Continued)

FOREIGN PATENT DOCUMENTS

| | | |
|---|---|---|
| JP | 4014040 A2 | 1/1992 |
| JP | 2734412 B2 | 3/1998 |

(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161-168.

(Continued)

*Primary Examiner* — Alvaro E Fortich
*Assistant Examiner* — Dilara Sultana
(74) *Attorney, Agent, or Firm* — Perkins Coie LLP

(57) ABSTRACT

Probe structures, probe arrays, have varying intrinsic material properties along their lengths. Methods of forming probes and probe arrays comprise varying the plating parameters to provide varying intrinsic material properties. Some embodiments provide deposition templates created using multiphoton lithography to provide probes with varying lateral configurations along at least portion of their lengths.

18 Claims, 8 Drawing Sheets

(56) References Cited

U.S. PATENT DOCUMENTS

| | | |
|---|---|---|
| 5,605,614 A | 2/1997 | Bornand |
| 5,811,982 A | 9/1998 | Beaman et al. |
| 5,865,641 A | 2/1999 | Swart et al. |
| 5,892,223 A | 4/1999 | Karpov et al. |
| 5,917,707 A | 6/1999 | Khandros et al. |
| 5,952,843 A | 9/1999 | Vinh |
| 5,994,152 A | 11/1999 | Khandros et al. |
| 6,043,563 A | 3/2000 | Eldridge et al. |
| 6,184,053 B1 | 2/2001 | Eldridge et al. |
| 6,208,155 B1 | 3/2001 | Barabi et al. |
| 6,218,203 B1 | 4/2001 | Khoury et al. |
| 6,250,933 B1 | 6/2001 | Khoury et al. |
| 6,255,126 B1 | 7/2001 | Mathieu et al. |
| 6,264,477 B1 | 7/2001 | Smith et al. |
| 6,268,015 B1 | 7/2001 | Mathieu et al. |
| 6,299,458 B1 | 10/2001 | Yamagami et al. |
| 6,329,827 B1 | 12/2001 | Beaman et al. |
| 6,336,269 B1 | 1/2002 | Eldridge et al. |
| 6,358,097 B1 | 3/2002 | Peters |
| 6,414,501 B2 | 7/2002 | Kim et al. |
| 6,426,638 B1 | 7/2002 | Di Stefano |
| 6,482,013 B2 | 11/2002 | Eldridge et al. |
| 6,491,968 B1 | 12/2002 | Mathieu et al. |
| 6,507,207 B2 | 1/2003 | Nguyen |
| 6,520,778 B1 | 2/2003 | Eldridge et al. |
| 6,560,861 B2 | 5/2003 | Fork et al. |
| 6,573,738 B1 | 6/2003 | Matsuo et al. |
| 6,624,645 B2 | 9/2003 | Haseyama et al. |
| 6,626,708 B2 | 9/2003 | Phillips |
| 6,651,325 B2 | 11/2003 | Lee et al. |
| 6,672,876 B1 | 1/2004 | Takekoshi |
| 6,690,185 B1 | 2/2004 | Khandros et al. |
| 6,720,781 B2 | 4/2004 | Ott et al. |
| 6,758,682 B1 | 7/2004 | Kosmala |
| 6,771,084 B2 | 8/2004 | Di Stefano |
| 6,777,319 B2 | 8/2004 | Grube et al. |
| 6,783,405 B1 | 8/2004 | Yen |
| 6,784,378 B2 | 8/2004 | Zhu et al. |
| 6,787,456 B1 | 9/2004 | Kripesh et al. |
| 6,807,734 B2 | 10/2004 | Eldridge et al. |
| 6,811,406 B2 | 11/2004 | Grube |
| 6,844,748 B2 | 1/2005 | Sato et al. |
| 6,855,010 B1 | 2/2005 | Yen |
| D507,198 S | 7/2005 | Kister |
| 6,935,901 B2 | 8/2005 | Simpson et al. |
| 6,967,492 B2 | 11/2005 | Tsui et al. |
| 6,998,857 B2 | 2/2006 | Terada et al. |
| 7,047,638 B2 | 5/2006 | Eldridge et al. |
| 7,063,541 B2 | 6/2006 | Grube et al. |
| 7,091,729 B2 | 8/2006 | Kister |
| 7,098,540 B1 | 8/2006 | Mohan et al. |
| 7,126,220 B2 | 10/2006 | Lahiri et al. |
| 7,131,848 B2 | 11/2006 | Lindsey et al. |
| 7,148,709 B2 | 12/2006 | Kister |
| 7,172,431 B2 | 2/2007 | Beaman et al. |
| 7,220,134 B2 | 5/2007 | Goodman et al. |
| 7,256,593 B2 | 8/2007 | Treibergs |
| 7,273,812 B2 | 9/2007 | Kim et al. |
| 7,279,917 B2 | 10/2007 | Williams et al. |
| 7,326,327 B2 | 2/2008 | Armstrong et al. |
| 7,412,767 B2 | 8/2008 | Kim et al. |
| 7,435,102 B2 | 10/2008 | Goodman |
| 7,436,192 B2 | 10/2008 | Kister |
| 7,437,813 B2 | 10/2008 | Tunaboylu et al. |
| 7,446,548 B2 | 11/2008 | Chen |
| 7,449,910 B2 | 11/2008 | Kirby et al. |
| 7,456,642 B2 | 11/2008 | Saulnier et al. |
| 7,462,800 B2 | 12/2008 | Tunaboylu et al. |
| 7,504,839 B2 | 3/2009 | Feigenbaum et al. |
| 7,504,840 B2 | 3/2009 | Arat et al. |
| 7,531,077 B2 | 5/2009 | Cohen et al. |
| 7,533,462 B2 | 5/2009 | Gleason et al. |
| 7,557,595 B2 | 7/2009 | Chen et al. |
| 7,579,856 B2 | 8/2009 | Khandros et al. |
| 7,583,098 B2 | 9/2009 | Tunaboylu et al. |
| 7,628,620 B2 | 12/2009 | Gritters |
| 7,629,807 B2 | 12/2009 | Hirakawa et al. |
| 7,637,007 B2 | 12/2009 | Tunaboylu et al. |
| 7,638,028 B2 | 12/2009 | Tunaboylu et al. |
| 7,674,112 B2 | 3/2010 | Gritters et al. |
| 7,690,925 B2 | 4/2010 | Goodman |
| 7,721,430 B2 | 5/2010 | Chartarifsky et al. |
| 7,731,546 B2 | 6/2010 | Grube et al. |
| 7,733,101 B2 | 6/2010 | Kister |
| 7,798,822 B2 | 9/2010 | Eldridge et al. |
| 7,808,261 B2 | 10/2010 | Kimoto |
| 7,841,863 B2 | 11/2010 | Mathieu et al. |
| 7,850,460 B2 | 12/2010 | Weiland et al. |
| 7,851,794 B2 | 12/2010 | Hobbs |
| 7,888,958 B2 | 2/2011 | Souma et al. |
| 7,922,544 B2 | 4/2011 | Chung |
| 7,928,751 B2 | 4/2011 | Hsu |
| 7,956,288 B2 | 6/2011 | Kazama et al. |
| 8,012,331 B2 | 9/2011 | Lee et al. |
| 8,111,080 B2 | 2/2012 | Kister |
| 8,130,007 B2 | 3/2012 | Eldridge et al. |
| 8,149,007 B2 | 4/2012 | Chen et al. |
| 8,299,394 B2 | 10/2012 | Theppakuttai et al. |
| 8,354,855 B2 | 1/2013 | Eldridge et al. |
| 8,415,963 B2 | 4/2013 | Kister |
| 8,427,186 B2 | 4/2013 | McFarland |
| 8,451,017 B2 | 5/2013 | Gleason et al. |
| 8,613,846 B2 | 12/2013 | Wu et al. |
| 8,717,054 B2 | 5/2014 | Chen et al. |
| 8,717,055 B2 | 5/2014 | Chen et al. |
| 8,723,543 B2 | 5/2014 | Chen et al. |
| 8,729,916 B2 | 5/2014 | Chen et al. |
| 8,742,272 B2 | 6/2014 | English et al. |
| 8,926,379 B2 | 1/2015 | Vinther |
| 9,005,420 B2 | 4/2015 | Tomantschger et al. |
| 9,030,222 B2 | 5/2015 | Eldridge et al. |
| 9,052,342 B2 | 6/2015 | Fan et al. |
| 9,097,740 B2 | 8/2015 | Kister |
| 9,121,868 B2 | 9/2015 | Kister |
| 9,244,101 B2 | 1/2016 | Cohen et al. |
| 9,316,670 B2 | 4/2016 | Kister |
| 9,476,911 B2 | 10/2016 | Kister |
| RE46,221 E | 11/2016 | Kister |
| 9,540,233 B2 | 1/2017 | Kumar et al. |
| 9,671,429 B2 | 6/2017 | Wu et al. |
| 9,702,904 B2 | 7/2017 | Breinlinger et al. |
| 9,972,933 B2 | 5/2018 | Kimura et al. |
| 10,215,775 B2 | 2/2019 | Wu et al. |
| 10,416,192 B2 | 9/2019 | Chen et al. |
| 10,641,792 B2 | 5/2020 | Wu et al. |
| 10,788,512 B2 | 9/2020 | Chen et al. |
| 10,877,067 B2 | 12/2020 | Chen et al. |
| 11,131,690 B2 | 9/2021 | Crippa |
| 2002/0196038 A1 | 12/2002 | Okuno et al. |
| 2003/0001606 A1 | 1/2003 | Bende et al. |
| 2004/0051541 A1 | 3/2004 | Zhou et al. |
| 2004/0134772 A1* | 7/2004 | Cohen .................. H01P 11/005 204/198 |
| 2005/0070170 A1 | 3/2005 | Zhang et al. |
| 2005/0104609 A1 | 5/2005 | Arat et al. |
| 2005/0176285 A1 | 8/2005 | Chen et al. |
| 2005/0179458 A1 | 8/2005 | Chen et al. |
| 2005/0184748 A1 | 8/2005 | Chen et al. |
| 2005/0189958 A1 | 9/2005 | Chen et al. |
| 2005/0253606 A1 | 11/2005 | Kim et al. |
| 2006/0006888 A1 | 1/2006 | Kruglick et al. |
| 2006/0051948 A1 | 3/2006 | Kim et al. |
| 2006/0053625 A1 | 3/2006 | Kim et al. |
| 2006/0170440 A1 | 8/2006 | Sudin |
| 2007/0144841 A1 | 6/2007 | Chong et al. |
| 2007/0200576 A1 | 8/2007 | Laurent et al. |
| 2008/0108221 A1 | 5/2008 | Kim et al. |
| 2008/0111573 A1 | 5/2008 | Chen et al. |
| 2008/0174332 A1 | 7/2008 | Arat et al. |
| 2009/0066351 A1 | 3/2009 | Arat et al. |
| 2009/0079455 A1 | 3/2009 | Gritters |
| 2010/0088888 A1 | 4/2010 | Mathieu et al. |
| 2010/0134131 A1 | 6/2010 | Chen et al. |
| 2010/0155253 A1 | 6/2010 | Kim et al. |

(56) References Cited

U.S. PATENT DOCUMENTS

| | | | |
|---|---|---|---|
| 2010/0176834 A1 | 7/2010 | Chen et al. | |
| 2011/0147223 A1 | 6/2011 | Kumar et al. | |
| 2011/0187397 A1 | 8/2011 | Chen et al. | |
| 2011/0187398 A1 | 8/2011 | Chen et al. | |
| 2011/0256356 A1 | 10/2011 | Tomantschger et al. | |
| 2012/0176122 A1 | 7/2012 | Hirata et al. | |
| 2014/0197145 A1* | 7/2014 | Veeramani | B23K 26/38 219/121.72 |
| 2014/0231264 A1 | 8/2014 | Chen et al. | |
| 2015/0021299 A1* | 1/2015 | Jensen | B23H 1/04 219/69.17 |
| 2017/0307657 A1* | 10/2017 | Crippa | H01R 13/03 |
| 2020/0241042 A1 | 7/2020 | Jeong et al. | |

FOREIGN PATENT DOCUMENTS

| | | |
|---|---|---|
| JP | 2001337110 A | 12/2001 |
| JP | 2004156993 A | 6/2004 |
| JP | 2004340617 A | 12/2004 |
| JP | 2004340654 A | 12/2004 |
| JP | 2008032400 A | 2/2008 |
| WO | 07097559 A1 | 8/2007 |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999, pp. 55-60.

Adam L. Cohen, "Electrochemical Fabrication (EFABTM)", Chapter 19 of the MEMS Handbook, edited by Mohamed Gad-El-Hak, CRC Press, 2002, p. 19/1-19/23.

Hill, Dr. Steve, "An E-FAB Way for Making the Micro World", Materials World is the journal of the Institute of Materials, Sep. 1999, vol. 7, No. 9, pp. 538-539.

Madden, John D. et al., "Three-Dimensional Microfabrication by Localized, Electrochemical Deposition", J. of Micro. Sys., Mar. 1996, 5(1):24-32.

Madou, Mark J., "Fundamentals of Microfabrication—The Science of Miniaturization", 2nd ed., 2001, pp. 402-412.

Marques, et al., "Fabrication of High-Aspect-Ratio Microstructures on Planar and Nonplanar Surfaces Using a Modified LIGA Process", Dec. 1997, 6(4):329-336.

Weeden, Otto, Keithley Instruments, Inc. "Probe Card Tutorial", pp. 1-40.

\* cited by examiner

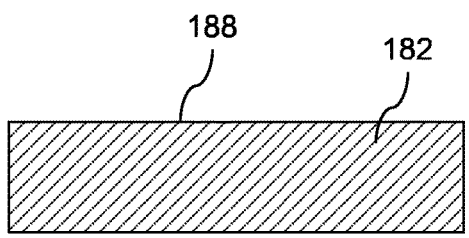
FIG. 1A
(PRIOR ART)
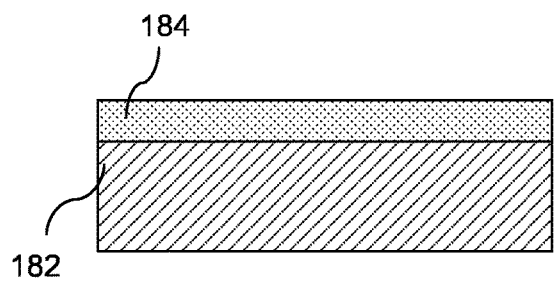
FIG. 1B
(PRIOR ART)
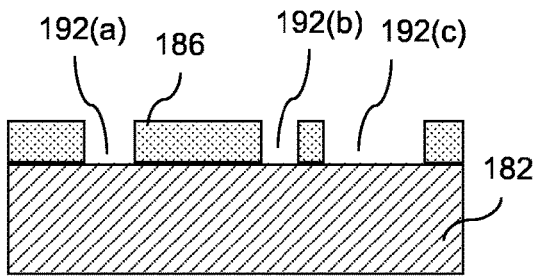
FIG. 1C
(PRIOR ART)
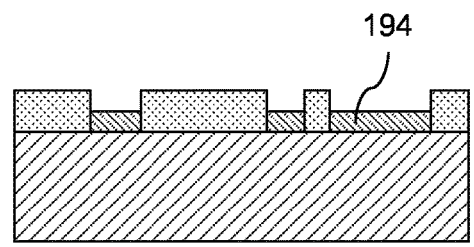
FIG. 1D
(PRIOR ART)
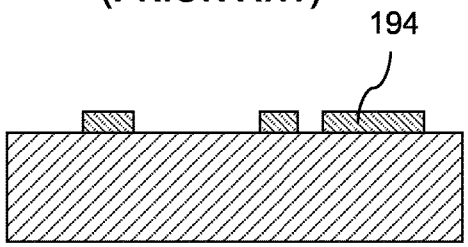
FIG. 1E
(PRIOR ART)
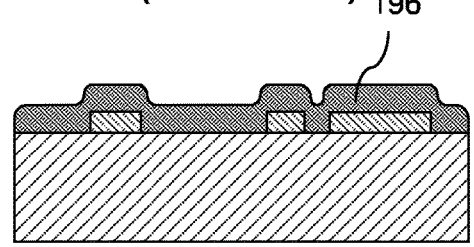
FIG. 1F
(PRIOR ART)
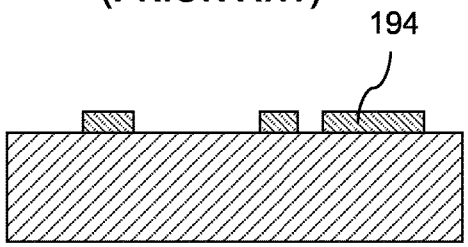
FIG. 1G
(PRIOR ART)
FIG. 1H
(PRIOR ART)
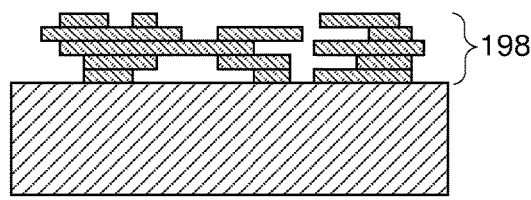
FIG. 1I
(PRIOR ART)

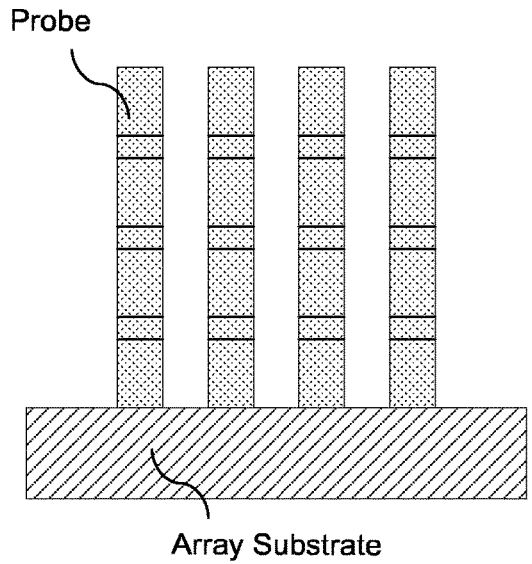
FIG. 2F1
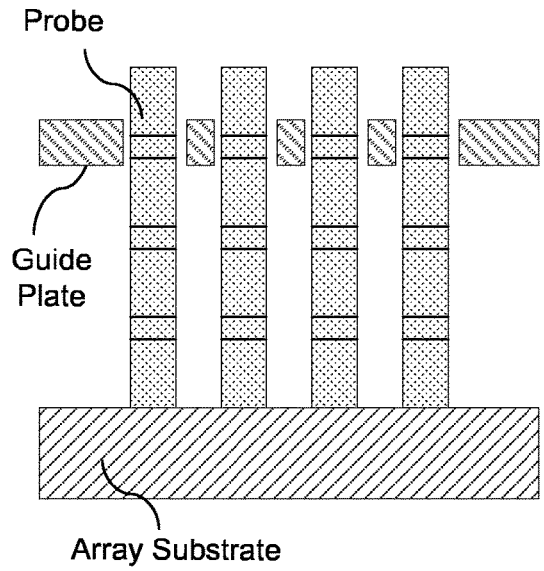
FIG. 2F2
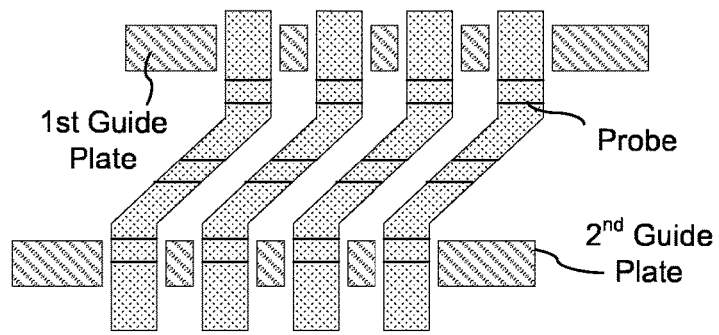
FIG. 2F4
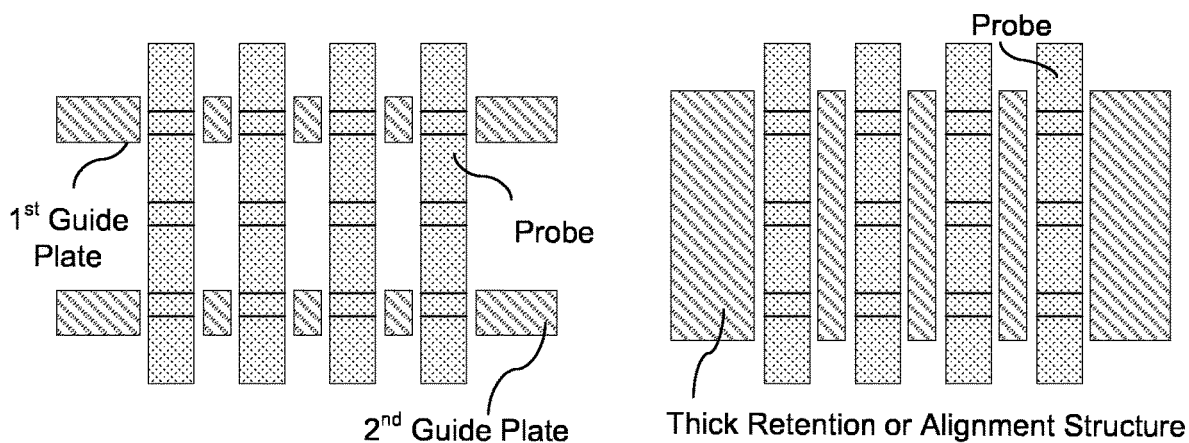
FIG. 2F3
FIG. 2F5

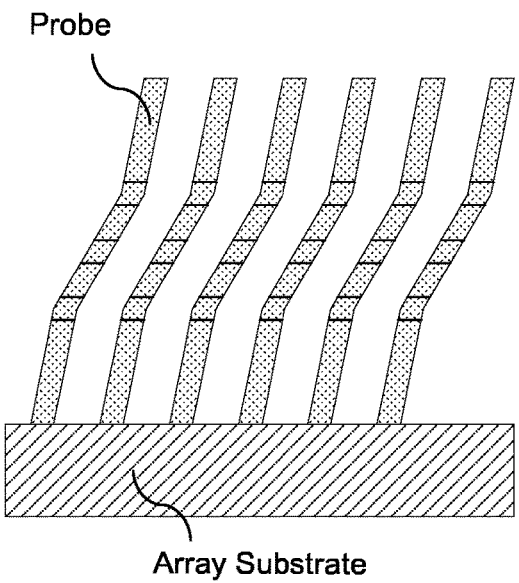
FIG. 3F1
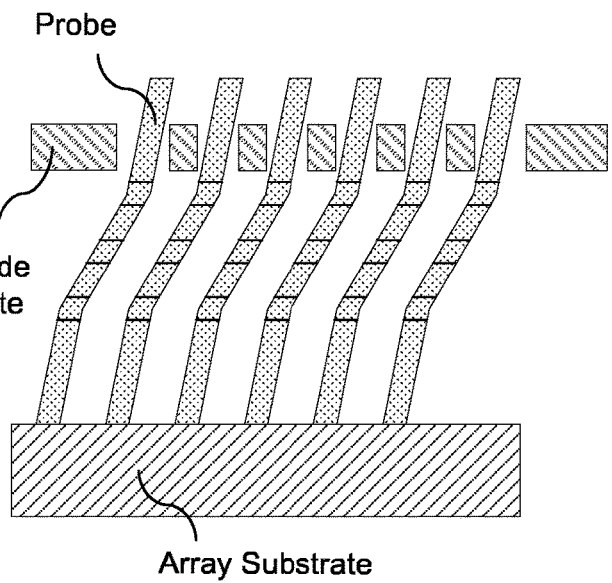
FIG. 3F2
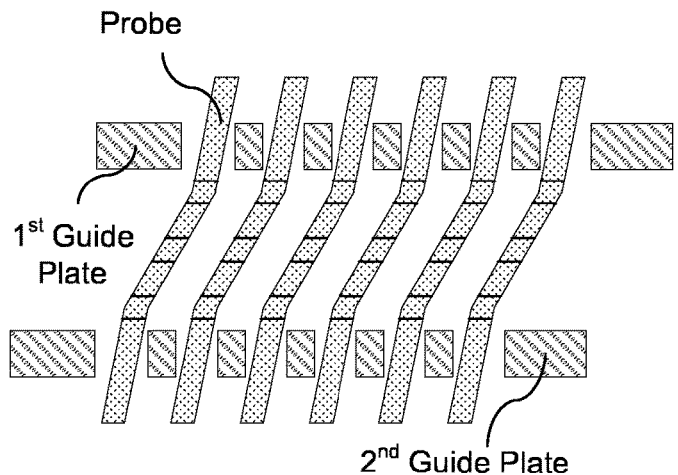
FIG. 3F3
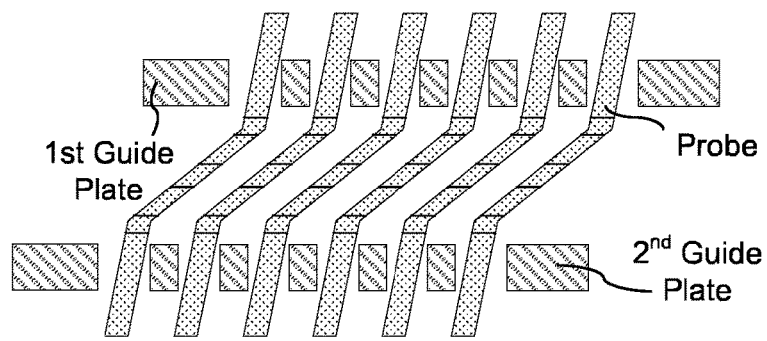
FIG. 3F4

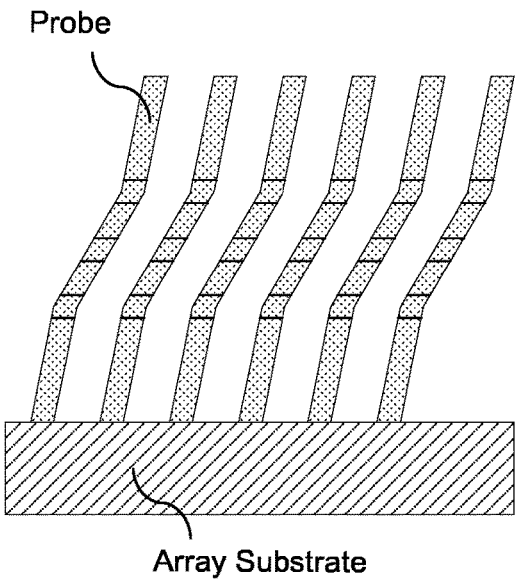
FIG. 4F1
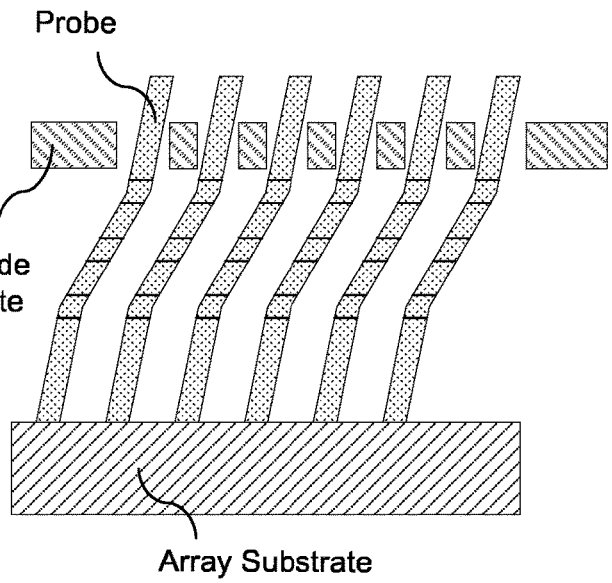
FIG. 4F2
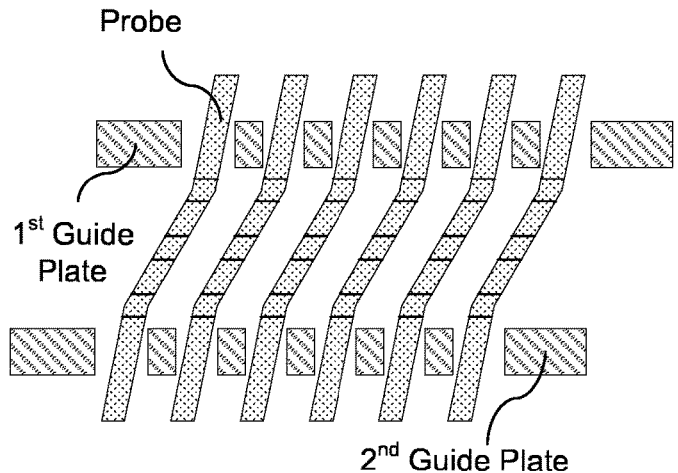
FIG. 4F3
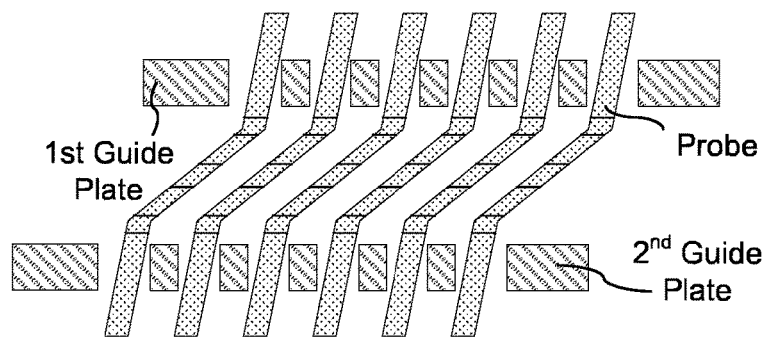
FIG. 4F4

METHOD OF IN SITU MODULATION OF STRUCTURAL MATERIAL PROPERTIES AND/OR TEMPLATE SHAPE

RELATED APPLICATIONS

The below table sets forth the priority claims for the instant application along with filing dates, patent numbers, and issue dates as appropriate. Each of the listed applications is incorporated herein by reference as if set forth in full herein including any appendices attached thereto.

| App. No. | Continuity Type | App. No. | Which was Filed | Which is now | Which issued on |
|---|---|---|---|---|---|
| This application | claims benefit of | 63/075,081 | 2020 Sep. 4 | pending | — |
| This application | claims benefit of | 63/073,428 | 2020 Sep. 1 | pending | — |

FIELD OF THE INVENTION

The present invention relates generally to the field of plated metal structures and more particularly, in some embodiments, to methods of forming probe preforms, probes, probe preform arrays, probe arrays, or subarrays for testing (e.g. wafer level testing or socket testing) of electronic components (e.g. integrated circuits), and even more particularly, the formation of such arrays or subarrays to provide in situ variations in material properties along a longitudinal length of the probes and/or to provide in situ variations in deposition template configuration and thus probe shape along lengths of the probes while being formed in array configurations.

BACKGROUND OF THE INVENTION

Probes:

Numerous electrical contact probe and pin configurations as well as array formation methods have been commercially used or proposed, some of which may be prior art while others are not. Examples of such pins, probes, arrays, and methods of making are set forth in the following patent applications, publications of applications, and patents. Each of these applications, publications, and patents is incorporated herein by reference as if set forth in full herein as are any teachings set forth in each of their prior priority applications.

| U.S. patent application No., Filing Date U.S. application Pub No., Pub Date U.S. patent No., Pub Date | First Named Inventor, "Title" |
|---|---|
| 10/772,943-Feb. 4, 2004 2005-0104609-May 19, 2005 — | Arat, et al., "Electrochemically Fabricated Microprobes" |
| 10/949,738-Sep. 24, 2004 2006-0006888-Jan. 12, 2006 — | Kruglick, et al., "Electrochemically Fabricated Microprobes" |
| 11/028,945-Jan. 3, 2005 2005-0223543-Oct. 13, 2005 7,640,651-Jan. 5, 2010 | Cohen, et al., "A Fabrication Process for Co-Fabricating a Multilayer Probe Array and a Space Transformer |
| 11/028,960-Jan. 3, 2005 2005-0179458-Aug. 18, 2005 7,265,565-Sep. 4, 2007 | Chen, et al. "Cantilever Microprobes for Contacting Electronic Components and Methods for Making Such Probes |
| 11/029,180-Jan. 3, 2005 2005-0184748-Aug. 25, 2005 | Chen, et al. "Pin-Type Probes for Contacting Electronic Circuits and Methods for Making Such Probes" |
| 11/029,217-Jan. 3, 2005 2005-0221644-Oct. 6, 2005 7,412,767-Aug. 19, 2008 | Kim, et al., "Microprobe Tips and Methods for Making" |
| 11/173,241-Jun. 30, 2005 2006-0108678-May 25, 2006 | Kumar, et al., Probe Arrays and Method for Making |
| 11/178,145-Jul. 7, 2005 2006-0112550-Jun. 1, 2006 7,273,812-Sep. 25, 2007 | Kim, et al., "Microprobe Tips and Methods for Making" |
| 11/325,404-Jan. 3, 2006 2006-0238209-Oct. 26, 2006 — | Chen, et al., "Electrochemically Fabricated Microprobes" |
| 14/986,500-Dec. 31, 2015 2016-0231356-Aug. 11, 2016 10,215,775-Feb. 26, 2019 | Wu, et al. "Multi-Layer, Multi-Material Micro-Scale and Millimeter-Scale Devices with Enhanced Electrical and/or Mechanical Properties" |
| 16/584,818-Sep. 26, 2019 — — | Smalley, "Probes Having Improved Mechanical and/or Electrical Properties for Making Contact between Electronic Circuit Elements and Methods for Making" |
| 16/584,863-Sep. 26, 2019 — — | Frodis, "Probes Having Improved Mechanical and/or Electrical Properties for Making Contact between Electronic Circuit Elements and Methods for Making" |
| 17/139,933-Dec. 31, 2020 (P-US399-A-MF) | Wu, "Compliant Pin Probes with Multiple Spring Segments and Compression Spring Deflection Stabilization Structures, Methods for Making, and Methods for Using" |
| 17/139,936-Dec. 31, 2020 (P-US400-A-MF) | Wu, "Probes with Multiple Springs, Methods for Making, and Methods for Using" |
| 17/139,940-Dec. 31, 2020 (P-US401-A-MF) | Wu, "Compliant Pin Probes with Flat Extension Springs, Methods for Making, and Methods for Using" |

-continued

| U.S. patent application No., Filing Date U.S. application Pub No., Pub Date U.S. patent No., Pub Date | First Named Inventor, "Title" |
|---|---|
| 16/791,288-Feb. 14, 2020 (P-US385-A-MF) | Frodis, "Multi-Beam Vertical Probes with Independent Arms Formed of a High Conductivity Metal for Enhancing Current Carrying Capacity and Methods for Making Such Probes" |
| 17/139,925-Dec. 31, 2020 (P-US398-A-MF) | Veeramani, "Probes with Planar Unbiased Spring Elements for Electronic Component Contact and Methods for Making Such Probes" |
| 17/240,962-Apr. 26, 2021 (P-US405-A-MF) | Lockard, "Buckling Beam Probe Arrays and Methods for Making Such Arrays Including Forming Probes with Lateral Positions Matching Guide Plate Hole Positions" |
| 17/384,680-Jul. 23, 2021 (P-US407-A-MF) | Yaglioglu, "Methods for Making Probe Arrays Utilizing Lateral Plastic Deformation of Probe Preforms" |
| 17/390,835-Jul. 30, 2021 (P-US408-A-MF) | Yaglioglu, "Methods for Making Probe Arrays Utilizing Deformed Templates" |
| 17/401,252-Aug. 12, 2021 (P-US409-A-MF) | Lockard, et al., "Probe Arrays and Improved Methods for Making and Using Longitudinal Deformation of Probe Preforms" |

As the pitch requirements of probing applications get more demanding, i.e. as tighter pitches are needed, achieving the required contact force without exceeding the yield stress of the material used becomes increasingly challenging, and as such, a need exists for methods for creating probe arrays allowing tailored control of material properties so that such requirements can be met.

SUMMARY OF THE INVENTION

It is a first object of some embodiments of the invention to provide an improved method of forming a probe array incorporating probes that have selected mechanical properties manipulated during formation of at least portions of the probes.

It is a second object of some embodiments of the invention to provide an improved method of forming probe arrays that incorporate multi-photon lithography in patterning at least portions of plating template material.

It is a third object of some embodiments of the invention to provide improved probes and probe arrays.

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, or alternatively may address some other object ascertained from the teachings herein. It is not intended that all objects, or even multiple objects, be addressed by any single aspect or embodiment of the invention even though that may be the case regarding some aspects.

In a first aspect of the invention a probe array, includes: (a) a plurality of probes, including: (i) an elastically deformable body portion having a first end and a second end; (ii) a first contact region connected directly or indirectly to the first end, wherein the first contact region is configured for a function selected from the group consisting of: (1) making temporary pressure based electrical contact to a first electronic component upon elastically biasing the deformable body with the first contact region against the first electronic component, and (2) bonding to the first electronic component for making permanent contact; and (iii) a second contact region connected directly or indirectly to the second end, wherein the second contact region is configured for making temporary pressure based electrical contact to a second electronic component upon elastically biasing the deformable body with the second contact region against the second electronic component, wherein multiple probes of the plurality of probes comprise at least one selected material located within at least two different portions along a length of each of the multiple probes wherein the at least one selected material at the at least two different portions has at least one different intrinsic material property (i.e. a material property that is independent of the amount of the selected material and the shape of the selected material present, e.g. yield strength, elastic modulus, and the like); and (b) at least one probe array retention structure selected from the group consisting of: (1) a substrate to which the first contact regions of the probes are bonded; (2) a substrate to which the first contact regions of the probes are bonded along with at least one guide plate having a plurality of holes which engage the probes; (3) a substrate to which the first contact regions of the probes are bonded along with at least one guide plate having a plurality of holes which engage the probes wherein the holes in at least one of the at least one guide plate are laterally shifted relative to the bonding locations on the substrate; (4) a plurality of guide plates each having a plurality of holes which engage the probes; (5) a plurality of guide plates each having a plurality of holes which engage the probes, wherein at least two of the plurality of guide plates have holes that engage probes that are laterally aligned; (6) a plurality of guide plates each having a plurality of holes which engage the probes, wherein at least two of the plurality of guide plates have holes that engage probes that are laterally shifted with respect to one another; and (7) a retaining structure or alignment structure into which the probes are inserted wherein the retaining structure or alignment structure has thickness selected from the group consisting of: (I) at least ¼ of a longitudinal length of the probes from first contact region to second contact region; (II) at least ½ of a longitudinal length of the probes from first contact region to second contact region; (III) at least ¾ of a longitudinal length of the probes from first contact region to second contact region.

Numerous variations of the first aspect exist and include for example: (1) each of a plurality of the probes comprise a plurality of adhered layers; (2) the first contact region of each of a plurality of probe is configured for bonding to the first electronic component for making permanent contact;

(3) the first contact region of each of a plurality of probes is configured for making temporary contact; (4) the at least two different portions are separated by an amount selected from the group consisting of: 1) at least 5 microns, 2) at least 10 microns, 3) at least 20 microns, 4) at least 50 microns, and (5) at least 100 microns; 5) variation 5 wherein the different intrinsic property is elastic modulus of the material wherein the difference between the smaller and the large is selected from the group consisting of: 1) at least 10% of the smaller, 2) at least 20% or the smaller, 3) at least 40% of the smaller, 4) at least 70% of the smaller, 5) at least 100% of the smaller, and 6) at least 140% of the smaller; (6) the at least two different portion form different parts of a compliant or spring portion of each probe; (7) variation 6 wherein the at least two different portions are separated by an amount selected from the group consisting of: 1) at least 5 microns, 2) at least 10 microns, 3) at least 20 microns, 4) at least 50 microns, and 5) at least 100 microns; (8) variation 7 wherein the different intrinsic property is elastic modulus of the material wherein the difference between the smaller and the large is selected from the group consisting of: 1) at least 10% of the smaller, 2) at least 20% or the smaller, 3) at least 40% of the smaller, 4) at least 70% of the smaller, 5) at least 100% of the smaller, and (6) at least 140% of the smaller.

In a second aspect of the invention a method of forming a probe array, includes: (a) forming a plurality of probes, including: (i) providing a build substrate; (ii) directly or indirectly on the substrate, providing at least one patterned template with a plurality of openings; (iii) providing a structural material into the plurality of openings to form at least a portion of a plurality of probes, wherein the providing of the structural material comprises a method selected from the group consisting of: (A) forming a plating template with a plurality of openings and then depositing a structural metal into the plurality of openings; (B) forming a plating template with a plurality of openings and then depositing a structural material wherein the deposition of the structural material comprises use of at least one different plating parameter values at at least two different heights along the length of the probes for the same structural material; (C) forming a plating template with a plurality of openings with the openings having lateral dimensions at different heights perpendicular to a plane of the template that are formed using multiphoton lithography; and (D) forming a plating template with a plurality of openings with the openings having lateral dimensions at different heights perpendicular to a plane of the template that are formed using multiphoton lithography and have varying lateral dimensions; wherein each of the plurality of probes comprise: (1) an elastically deformable body portion having a first end and a second end; (2) a first contact region connected directly or indirectly to the first end, wherein the first contact region is configured for a function selected from the group consisting of: (1) making temporary pressure based electrical contact to a first electronic component upon elastically biasing the deformable body with the first contact region against the first electronic component, and (2) bonding to the first electronic component for making permanent contact; and (3) a second contact region connected directly or indirectly to the second end, wherein the second contact region is configured for making temporary pressure based electrical contact to a second electronic component upon elastically biasing the deformable body with the second contact region against the second electronic component, and (b) providing at least one probe array retention structure and configuring the probes and at least one retention structure according to a process selected from the group consisting of: (i) providing a probe substrate to which the first contact regions of the probes are bonded, wherein the probe substrate comprises the build substrate; (ii) providing a probe substrate and bonding the first contact regions of the probes to the probe substrate wherein the probe substrate and the build substrate are different; (iii) providing a probe substrate to which the first contact regions of the probes are bonded wherein the probe substrate comprises the build substrate; (iv) providing a probe substrate and bonding the first contact regions of the probes to the probe substrate wherein the probe substrate and build substrate are different, and providing at least one guide plate having a plurality of holes that engage the probes; (v) providing a probe substrate and bonding the first contact regions of the probes to the probe substrate wherein the probe substrate and build substrate are different, and providing at least one guide plate having a plurality of holes and inserting the probes into the holes in the guide plate wherein holes in the guide plate are laterally aligned with bonding locations on the substrate; (vi) providing a probe substrate and bonding the first contact regions of the probes to the probe substrate wherein the probe substrate and build substrate are different, and providing at least one guide plate having a plurality of holes and inserting the probes into the holes in the guide plate, and laterally shifting the guide plate and the substrate so that holes in the guide plate are laterally shifted with respect to bonding locations on the substrate; (vii) providing a plurality of guide plates each having a plurality of holes which engage the probes; (viii) providing a plurality of guide plates each having a plurality of holes and engaging the probes with holes in at least one of the guide plates; (ix) providing a plurality of guide plates each having a plurality of holes which engage the probes, wherein at least two of the plurality of guide plates have holes that engage probes that are laterally aligned; and (x) providing a plurality of guide plates each having a plurality of holes which engage the probes, wherein at least two of the plurality of guide plates have holes that engage probes that are laterally shifted with respect to one another; (xi) providing a plurality of guide plates each having a plurality of holes which engage the probes, and laterally shifting at least two of the plurality of guide plates respectively so that holes that engage probes in the two guide plats are laterally shifted with respect to one another; (12) providing a plurality of guide plates each having a plurality of holes and engaging the probes with the holes in at least one of the guide plates, wherein at least two of the plurality of guide plates have holes that engage probes that are laterally shifted with respect to one another; and (13) providing a retaining structure or alignment structure into which the probes are inserted wherein the retaining structure or alignment structure has thickness selected from the group consisting of: (A) at least ¼ of a longitudinal length of the probes from first contact region to second contact region; (B) at least ½ of a longitudinal length of the probes from first contact region to second contact region; (C) at least ¾ of a longitudinal length of the probes from first contact region to second contact region.

Numerous variations of the first aspect exist and include for example: (1) forming a plurality of adhered layers; (2) the first contact region is configured for bonding to the first electronic component for making permanent contact; (3) the first contact region is configured for making temporary contact; (4) multiple probes of the plurality of probes comprise at least one selected material located within at least two different portions along a length of each of the multiple probes wherein the at least one selected material at the at least two different portions has at least one different intrinsic material property (i.e. a material property that is independent of the amount of the selected material and the shape of the selected material present, e.g. yield strength, elastic modulus, and the like); (5) variation wherein the different intrinsic property is elastic modulus of the material wherein the difference between the smaller and the large is selected from the group consisting of: 1) at least 10% of the smaller, 2) at least 20% or the smaller, 3) at least 40% of the smaller, 4) at least 70% of the smaller, 5) at least 100% of the smaller, and 60 at least 140% of the smaller; (6) variation 5 wherein the different intrinsic property is elastic modulus of the material wherein the difference between the smaller and the large is selected from the group consisting of: 1) at least 10% of the smaller, 2) at least 20% or the smaller, 3) at least 40% of the smaller, 4) at least 70% of the smaller, 5) at least 100% of the smaller, and at least 140% of the smaller; (7) variation 6 wherein the different intrinsic property is elastic modulus of the material wherein the difference between the smaller and the large is selected from the group consisting of: 1) at least 10% of the smaller, 2) at least 20% or the smaller, 3) at least 40% of the smaller, 4) at least 70% of the smaller, 5) at least 100% of the smaller, and 6) at least 140% of the smaller; (8) variation 4 wherein the at least two different portion form different parts of a compliant or spring portion of each probe; (9) variation 8 wherein the at least two different portions are separated by an amount selected from the group consisting of: 1) at least 5 microns, 2) at least 10 microns, 3) at least 20 microns, 4) at least 50 microns, and 5) at least 100 microns; and (10) variation 8 wherein the different intrinsic property is elastic modulus of the material wherein the difference between the smaller and the large is selected from the group consisting of: 1) at least 10% of the smaller, 2) at least 20% or the smaller, 3) at least 40% of the smaller, 4) at least 70% of the smaller, 5) at least 100% of the smaller, and 6) at least 140% of the smaller.

Other aspects of the invention will be understood by those of skill in the art upon review of the teachings herein and for example may include alternatives in the configurations or processes set forth herein, decision branches noted in those processes or configurations, or partial or complete exclusion of such alternatives and/or decision branches in favor of explicitly setting forth process steps or features along with orders to be used in performing such steps or connections between such features. Some aspects may provide device counterparts to method of formation aspects, some aspects may provide method of formation counterparts to device aspects, and other aspects may provide for methods of use for the probe arrays provided herein.

BRIEF DESCRIPTION OF THE DRAWINGS

FIGS. 1A-1F schematically depict the formation of a first layer of a structure using adhered mask plating where the blanket deposition of a second material overlays both the openings between deposition locations of a first material and the first material itself.

FIG. 1G depicts the completion of formation of the first layer resulting from planarizing the deposited materials to a desired level.

FIGS. 1H and 1I respectively depict the state of the process after formation of the multiple layers of the structure and after release of the structure from the sacrificial material.

FIGS. 2F1-2F5 illustrate side views of example probe arrays or preform arrays including probes or preforms of the type shown in FIG. 2C wherein the arrays include different types of guide and/or mounting structures.

FIGS. 3A-3F4 illustrate a second embodiment providing variations of material properties at different heights along the lengths of probes or probe preforms while the probes or preforms are formed in an array configuration where the shape of the probes or preforms are provided by patterning multiple layers of different photoresists to provide vertical openings and then deforming the template using lateral shearing, wherein structural material is deposited into the openings using at least one or more variations in plating parameters along their lengths to provide different material properties at different heights along the prove or preform lengths.

FIGS. 4A-4F4 illustrate a third embodiment that may provide varying of material properties along the lengths of probes being formed while in array configurations or simply provide unique probe configurations (i.e. configurations that may not be readily obtainable from multi-layer formation or deformation based methods) where the probes have a shape based on use of multi-photon lithography to provide patterning of a photoresist which may be developed to provide openings of desired configurations for receiving deposited structural material to provide probes of desired configurations (e.g. fixed or varying cross-sectional widths, curvatures, bends, and the like) and the probes may or may not be formed with different material properties along their lengths based variations in plating parameters.

DETAILED DESCRIPTION OF PREFERRED EMBODIMENTS

Electrochemical Fabrication in General

Figure 2A:
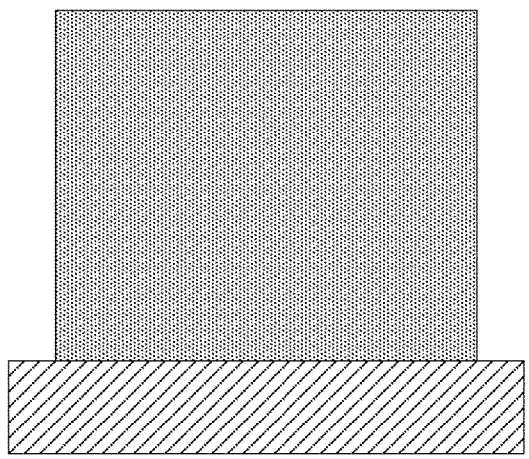
FIGS. 2A-2E illustrate a first embodiment providing variations of material properties at different heights along the lengths of probes or probe preforms while the probes or preforms are formed in an array configuration where the shape of the probes or preforms are provided by patterning of a photoresist to provide vertical openings for receiving deposited structural material to form straight probes or probe preforms wherein the probes or preforms are formed with different plating parameters along their lengths to provide different material properties at different heights along those lengths.

Various implementations of the present invention may use single or multi-layer electrochemical deposition processes that are similar to those set forth in U.S. Pat. No. 6,027,630, issued on Feb. 22, 2000 to Adam Cohen or in U.S. Pat. No. 5,190,637 to Henry Guckel.

FIGS. 1A-1I are provided to illustrate techniques that may be useful. FIGS. 1A-1I illustrate side views of various states in an example multi-layer, multi-material electrochemical fabrication process. FIGS. 1A-1G illustrate various stages in the formation of a single layer of a multi-layer fabrication process where a second metal is deposited on a first metal as well as in openings in the first metal so that the first and second metals form part of the layer. In FIG. 1A, a side view of a substrate 182 having a surface 188 is shown, onto which patternable photoresist 184 is deposited, spread, or cast as shown in FIG. 1B. In FIG. 1C, a pattern of resist is shown that results from the curing, exposing, and developing of the resist. The patterning of the photoresist 184 results in openings or apertures 192(*a*)-192(*c*) extending from a surface 186 of the photoresist through the thickness of the photoresist to surface 188 of the substrate 182. In FIG. 1D, a metal 194 (e.g. nickel) is shown as having been electroplated into the openings 192(*a*)-192(*c*). In FIG. 1E, the photoresist has been removed (i.e. chemically stripped) from the substrate to expose regions of the substrate 182 which are not covered with the first metal 194. In FIG. 1F, a second metal 196 (e.g. silver) is shown as having been blanket electroplated over the entire exposed portions of the substrate 182 (which is conductive) and over the first metal 194 (which is also conductive). FIG. 1G depicts the completed first layer of the structure which has resulted from the planarization of the first and second metals down to a height that exposes the first metal and sets a thickness for the first layer. In FIG. 1H, the result of repeating the process steps shown in FIGS. 1B-1G several times to form a multi-layer structure is shown where each layer consists of two materials. For most applications, one of these materials is removed as shown in FIG. 1I to yield a desired 3-D structure 198 (e.g. component or device).

Some Definitions

Definitions of various terms and concepts that may be used in understanding the embodiments of the invention (either for the devices or structures themselves, certain methods for making the devices or structures, or certain methods for using the devices or structures) will be understood by those of skill in the art. Some such terms and concepts are discussed herein while other such terms are addressed in the various patent applications to which the present application claims priority and/or which are incorporated herein by reference. Additional definitions and information about electrochemical fabrication methods may be found in a number of the various applications incorporated herein by reference such as, for example, U.S. patent application Ser. No. 16/584,818, filed Sep. 26, 2019 and entitled "Probes Having Improved Mechanical and/or Electrical Properties for Making Contact Between Electronic Circuit Elements and Methods for Making".

The term "longitudinal" as used herein refers to a long dimension of a probe, an end-to-end dimension of the probe, or a tip-to-tip dimension. Longitudinal may refer to a generally straight line that extends from one end of the probe to another end of the probe or it may refer to a curved or stair-stepped path that has a sloped or even changing direction along a height of the probe. When referring to probe arrays, the longitudinal dimension may refer to a particular direction the probes in the array point or extend but it may also simply refer to the overall height of the array that starts at a plane containing a first end, tip, or base of a plurality of probes and extends perpendicular thereto to a plane containing a second end, tip, or top of the probes. The context of use typically makes clear what is meant especially to those of skill in the art. It is intended that the interpretation to be applied to the term herein be as narrow as warranted by the details of the description provided or the context in which the term is used. If however, no such narrow interpretation is warranted, it is intended that the broadest reasonable scope of interpretation apply.

The term "lateral" as used herein is related to the term longitudinal. In terms of the stacking of layers, lateral refers to a direction within each layer, or two perpendicular directions within each layer (i.e. one or more directions that lie within a plane of a layer that are substantially perpendicular to the longitudinal direction). When referring to probe arrays laterally generally has a similar meaning in that a lateral dimension is generally a dimension that lies in a plane that is parallel to a plane of the top or bottom of the array (i.e. substantially perpendicular to the longitudinal dimension. When referring to probes themselves, the lateral dimensions may be those that are perpendicular to an overall longitudinal axis of the probe, a local longitudinal axis of the probe (that is local lateral dimensions), or simply the dimensions similar to those noted for arrays or layers. The context of use typically makes clear what is meant especially to those of skill in the art. It is intended that the interpretation to be applied to the term herein be as narrow as warranted by the details of the description provided or the context in which the term is used. If no such narrow interpretation is warranted, it is intended that the broadest reasonable scope of interpretation apply.

When referring to longitudinal or lateral, the term substantially means within a particular angular orientation of the longitudinal or a lateral direction wherein the angle may be within 1°, within 2°, within 5°, or in some cases within 10° depending on the context.

Probe and Probe Array Formation Embodiments:

In a first embodiment of this invention, a method introduces sections, along the height (i.e. longitudinal length) of a probe, with each section provided with different material properties. Varying material properties along the length of a probe or probe preform, an array of simultaneously formed probes or probe preforms, or other structure in a discontinuous or continuous manner may aid in (1) optimizing the tradeoff between contact force (stiffness) and yield stress at a given overtravel, (2) may address the tradeoff between scrub length and contact resistance, (3) may enable the formation of probes with enhanced properties that will enable formation of tighter pitch arrays while meeting contact force and overtravel requirements without exceeding Young's modulus or yield strength material limitations, and/or (4) allow the simultaneous formation of probes or preforms while in array configurations with required properties and production yields.

FIGS. 2A-2E illustrate a first embodiment providing variations of material properties at different heights along the lengths of probes or probe preforms while the probes or preforms are formed in an array configuration where the shape of the probes or preforms are provided by patterning of a photoresist to provide vertical openings for receiving deposited structural material to form straight probes or probe preforms wherein the probes or preforms are formed with different plating parameters along their lengths to provide different material properties at different heights along those lengths.

Figure 2B:
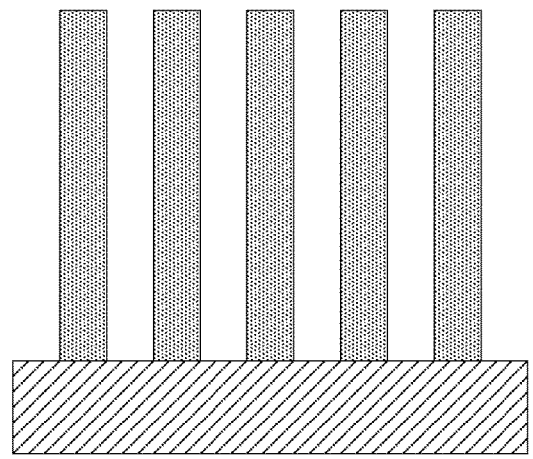
Figure 2C:
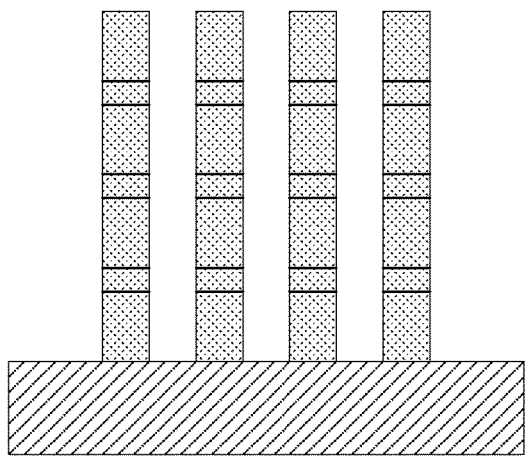
Figure 2D:
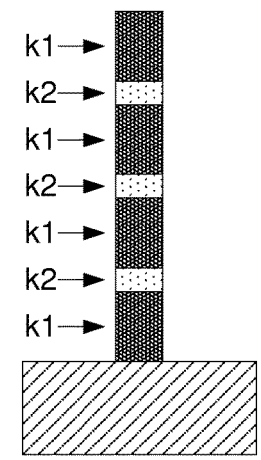
Figure 2E:
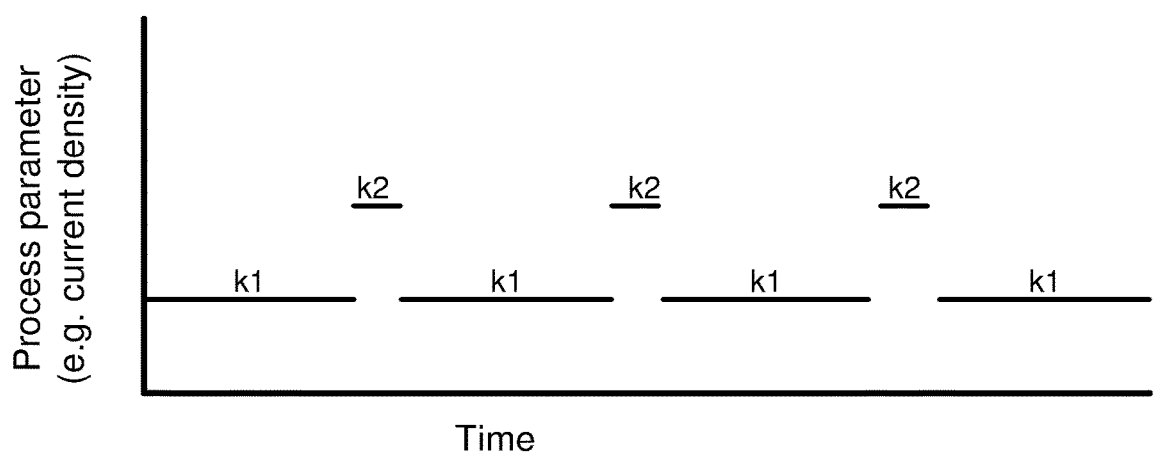

FIG. 2A shows a cut view the state of the process after a photoresist material or other masking material is deposited or applied to a substrate while FIG. 2B shows a cut view of the state of the process after formation of openings in the photoresist (e.g. by exposure and development), wherein the openings correspond to locations where probes or preforms will be formed while potentially in an array pattern. FIG. 2C shows the state of the process after deposition of structural material into the openings to form the probes or preforms, possible planarization of the structural material, and removal of the photoresist. FIG. 2D provides a schematic illustration showing different material properties at different heights along the length of the probe wherein, in this example, the property illustrated is elastic modulus or Young's modulus having two different values K1 and K2 where K1 is greater than K2. FIG. 2E provides a graphic representation of a plating parameter (e.g., plating current density) versus plating time along with the material property that results from the deposition wherein a lower current density is used for longer periods of time to create the longer length sections of material having the higher modulus (K1) while a shorter plating time at higher current density is used to create shorter sections (heights) having the lower modulus (K2). In actual practice, the modulus variations may take on more than two different values and will be targeted to position and heights that provide appropriate probe properties in relationship to intended deformation locations on the probes, interactions with guide plates or other array structures.

FIGS. 2F1-2F5 illustrate side views of example probe arrays or preform arrays including probes or preforms of the type shown in FIG. 2C wherein the arrays include different types of guide and/or mounting structures. FIG. 2F1 shows a plurality of example probes held in an array configuration by a permanent substrate that may or may not be a build substrate. FIG. 2F2 shows a plurality of example probes held in an array configuration by a combination of a permanent substrate and a guide plate. FIG. 2F3 shows example probes held in an array configuration by a plurality of guide plates. FIG. 2F4 shows example probes that have either been pre-shaped or shaped by relative lateral movement of the two guide plates of FIG. 2F3. FIG. 2F5 shows a plurality of probes held in an array configuration by a thick retention or alignment plate.

In a generalization of the process of FIGS. 2A-2C, as plating progresses from bottom to top within the openings in the photoresist, the plating parameters may be varied in a number of different ways to cause plated structural material to have different properties along the probe length. For example, plating may occur by one or more of:

(1) Direct current plating with a current density that is fixed at any given time but is made to change from one value to another in a substantially discontinuous manner to cause relatively abrupt changes in grain size formation of deposited metals and thus changes in yield strength of the deposited metal at a given height of deposition. Times between current density changes may range from seconds to tens of seconds or even to minutes such that deposit thickness at any given current density ranges from tenths of microns, to microns, to tens of microns.

(2) Direct current plating with relatively slow transitions in current density from one value to another (i.e. from a local temporal minimum value to a local temporal maximum value, and vice-a-versa) where such transitions may occur over seconds, to tens of seconds, to even minutes uniformly in the transition between values.

(3) Pulsed current plating which has a first fast oscillation rate associated with the pulsing but a slower rate of change between changes to one or both of minimum and/or maximum current densities, or even duty cycle, to produce changes in material properties similar to those noted in (1) and (2) above. The fast oscillations may occur with a frequency range of 1 hz to 100 hz, or faster, and a duty cycle ranging from 5% to 95% with material property variations in resulting depositions occurring based on different frequencies and duties cycles which may deviate from properties resulting from a direct current deposition at a similar averaged current density. Though such high frequency pulsing variations may be used in the some implementations of the present invention, since the variations of primary interest in the present application are those related to different regions of material that are each microns to tens of microns in height, it is the slower rates of rates of change between at least one of maximum current density, minimum current density and even applied duty cycle that may bring the types of changes in material properties that are of interest herein.

(4) Reversed pulse plating with slow variations in associated parameters.

(5) Plating with variations in bath temperature.

(6) Plating with variations in plating bath flow or agitation and/or orientation of a plating surface.

Figure 5A:
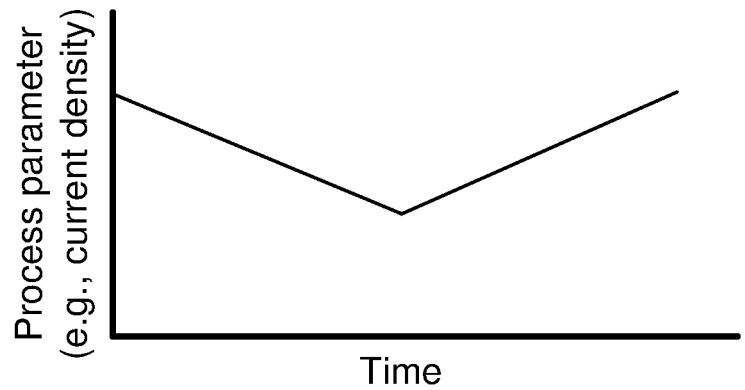
FIGS. 5A and 5B provide an example illustrating how a change in process parameters can result in material property change that can vary in a continuous manner as opposed to a discontinuous manner.
Figure 5B:
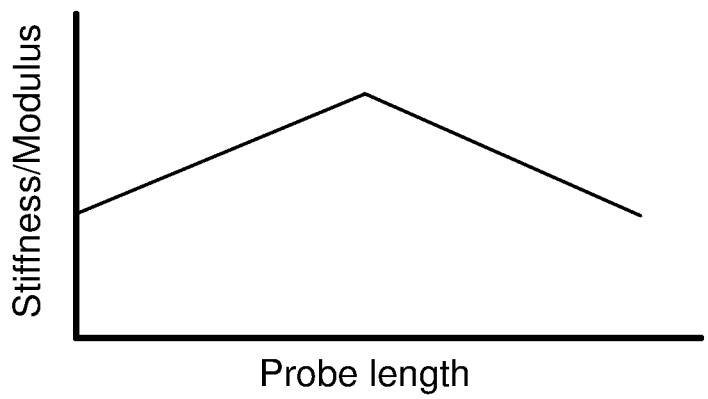

In some alternatives to the process illustrated in the embodiment of FIGS. 2A-2F5, in addition to forming the probes or performs from deposited, structural metal or metals, other materials may be co-deposited, selectively coated, or blanket coated over the formed probes or preforms wherein the other materials may include ceramics, nano-fibers, dielectrics, adhesion materials, barrier materials, and/or bonding materials and the like. In some variations, plating may be only partially completed, non-plating processing steps may then occur, and then plating continued wherein the non-plating process may contribute to changes in the properties of the deposited material at different heights of deposition. In still other embodiments, the photoresist may take the form of multiple layers with patterning of the photoresist occurring after formation of each layer, after formation of a portions of the layers, or only after the formation of all of the layers. When performing multiple patterning operations, the patterning used may vary to form openings with shapes other than linear vertical shapes. Some of patterning operations may be followed by development operations and possible backfilling operations or such development operations may be delayed until all of the patternings (e.g., exposures) have occurred. In some embodiments, properties may be changed in a discontinuous manner while in other embodiments, as shown in FIGS. 5A and 5B, properties may be varied in a continuous manner so as to avoid stair-stepped and stress focusing transitions.

FIGS. 3A-3E illustrate a second embodiment providing variations of material properties at different heights along the lengths of probes or probe preforms while the probes or preforms are formed in an array configuration where the shape of the probes or preforms are provided by patterning multiple layers of different photoresists template to provide vertical openings and then deforming the template using lateral shearing. After deformation, the patterned photoresist is developed to reveal the openings, or if openings already exist, the process moves to depositing structural material into the openings using at least one or more variations in plating parameters along their lengths to provide different material properties at different heights along those lengths (as shown seven variations are used to produce seven different longitudinal levels have different material properties). As illustrated, at least some of the layers of photoresist have different stiffnesses such that upon lateral deformation, the photoresist inherently provides not only angled openings but openings with different angular orientations at different vertical levels such that upon receiving deposition of structural material, probes or preforms are formed with curves or multiple differently angled segments as well as with different material properties along their lengths.

Figure 3A:
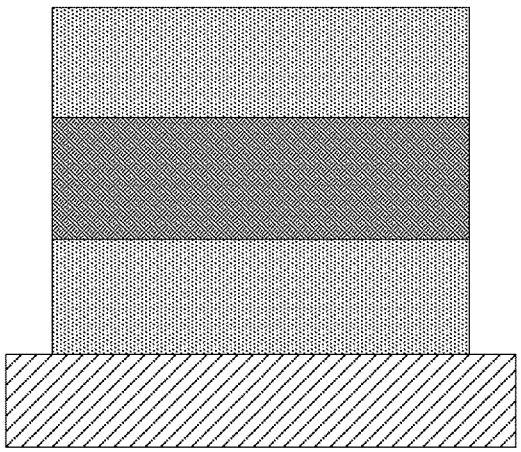
Figure 3B:
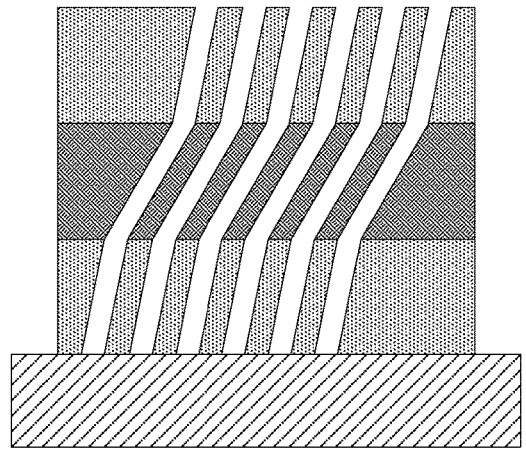
Figure 3C:
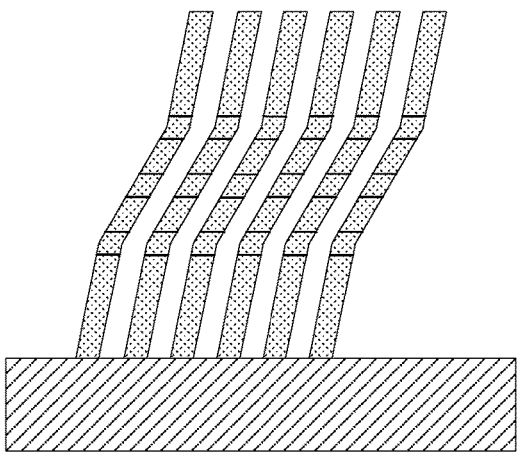

FIG. 3A shows a cut view the state of the process after three different layers of photoresist material have been deposited with the central layer being stiffer than the lower and upper layers. FIG. 3B shows a cut view of the state of the process after formation of openings in the layers of photoresist, after lateral deformation of the photoresist, and after development of the photoresist wherein each opening represents a location for a probe or preform which may have relative positions that correspond to array positions for the probes. FIG. 3C shows the state of the process after deposition of structural material into the openings to form the probes or preforms, possible planarization of the structural material, and removal of the photoresist wherein each probe includes two bends or changes in orientation. More information about template deformation as used in the embodiment of FIGS. 3A-3C, can be found in U.S. patent application Ser. No. 17/390,835, entitled "Improved Method for Making Probe Arrays Utilizing Deformed Templates" by Yaglioglu, filed Jul. 20, 2021 which is incorporated herein by reference. The photoresist as a whole provides not only angled openings but openings with different angular orientations at different vertical levels such that curved or multi-angled openings are formed for receiving deposition of structural material such that probes are formed with curves or multiple differently angled segments.

Figure 3D:
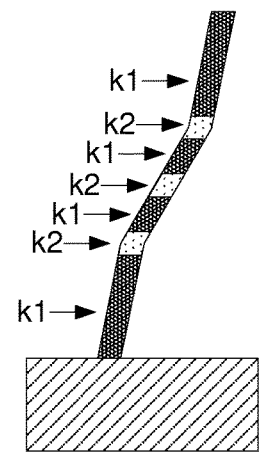
Figure 3E:
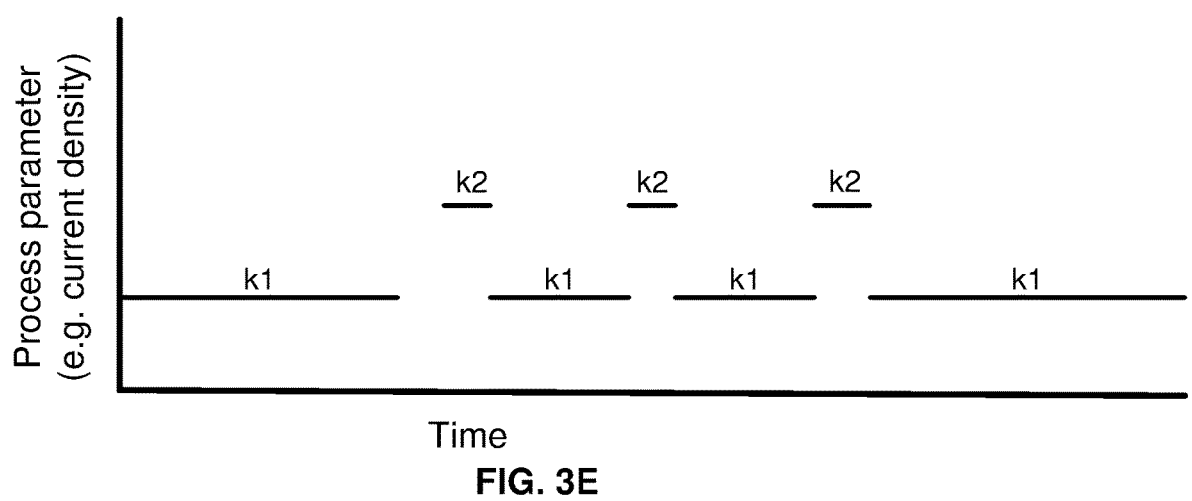

FIG. 3D provides a schematic illustration showing different material properties at different heights along the length of the probe wherein, in this example, the property illustrated is elastic modulus or Young's modulus having two different values K1 and K2 where K1 is greater than K2. FIG. 2E provides a graphic representation of a plating parameter (e.g., plating current density) versus plating time along with the material property that results from the deposition wherein a lower current density is used for longer periods of time to create the longer length sections of material having the higher modulus (K1) while a shorter plating time at higher current density is used to create shorter sections (heights) having the lower modulus (K2). In actual practice, the modulus variations may take on more than two different values and will be targeted to position and heights that provide appropriate probe properties in relationship to intended deformation locations on the probes, interactions with guide plates or other array structures.

The order of operations between the states shown in FIGS. 3A to 3C may vary, for example, exposure of the layers of photoresist may occur after each is formed or it may occur in as a single exposure after all layers are formed. In some implementations, the photoresist may be exposed, then deformation may occur and then development may occur, or alternatively, the photoresist may be exposed followed by development and then by deformation. In still other variations, the deposition of structural material may occur prior to deformation.

FIGS. 3F1-3F4 illustrate side views of example probe arrays or preform arrays including probes or preforms of the type shown in FIG. 3C wherein the arrays include different types of guide and/or mounting structures. FIG. 3F1 shows a plurality of example probes held in an array configuration by a permanent substrate that may or may not be a build substrate. FIG. 3F2 shows a plurality of example probes held in an array configuration by a combination of a permanent substrate and a guide plate. FIG. 3F3 shows example probes held in an array configuration by a plurality of guide plates. FIG. 3F4 shows example probes that have been shaped by relative lateral movement of the two guide plates of FIG. 3F3.

As with the embodiment of FIGS. 2A-2F5, multiple variations of the embodiment of FIGS. 3A-3F4 are possible and include for example: (1) use of different numbers of template deformation levels, (2) use of deformation tools that control bending of the template at different levels regardless of whether or not distinct stiffnesses exist, (3) different numbers and locations of material property variations may be induced in the plated probes, (4) arrays may be linear in configuration or they may be two-dimensional, (5) probe counts, probe spacings, probe diameters, probe heights, probe configurations, and/or probe pitch may be different and may be uniform or non-uniform.

FIGS. 4A-4E illustrate a third embodiment that may provide varying of material properties along the lengths of probes being formed while in array configurations or simply provide unique probe configurations (i.e. configurations that may not be readily obtainable from multi-layer formation or deformation based methods) where the probes have a shape based on use of multi-photon lithography to provide patterning of a photoresist which may be developed to provide openings of desired configurations for receiving deposited structural material to provide probes of desired configurations (e.g. fixed or varying cross-sectional widths, curvatures, bends, and the like) and the probes may or may not be formed with different material properties along their lengths based variations in plating parameters.

Figure 4A:
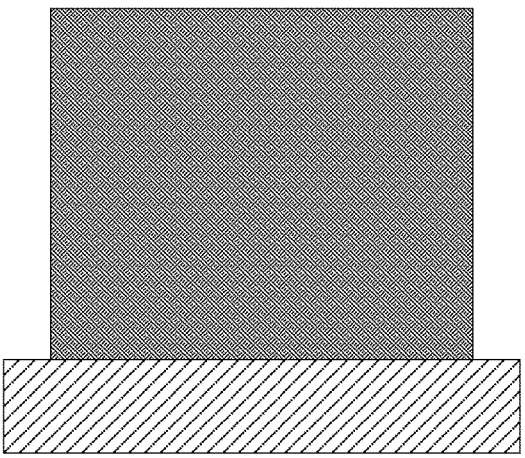
Figure 4B:
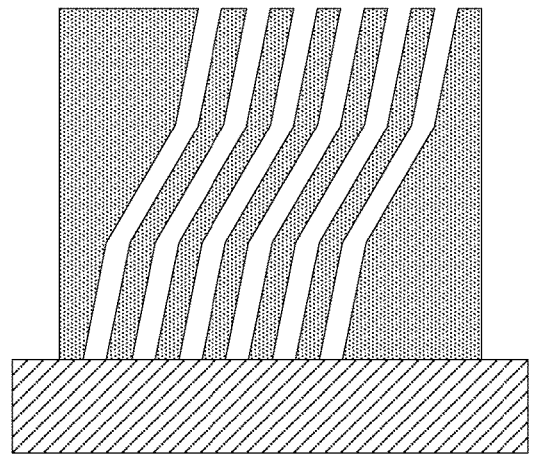
Figure 4C:
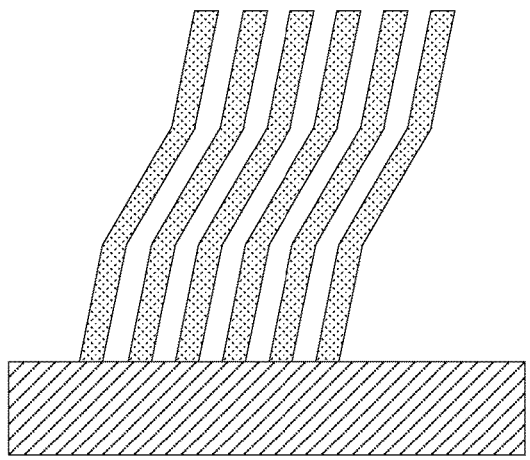
Figure 4D:
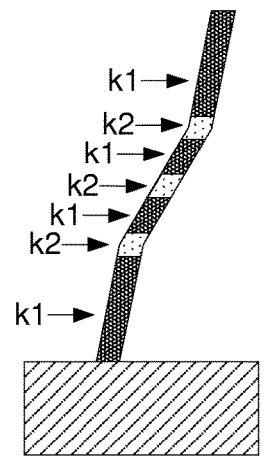
Figure 4E:
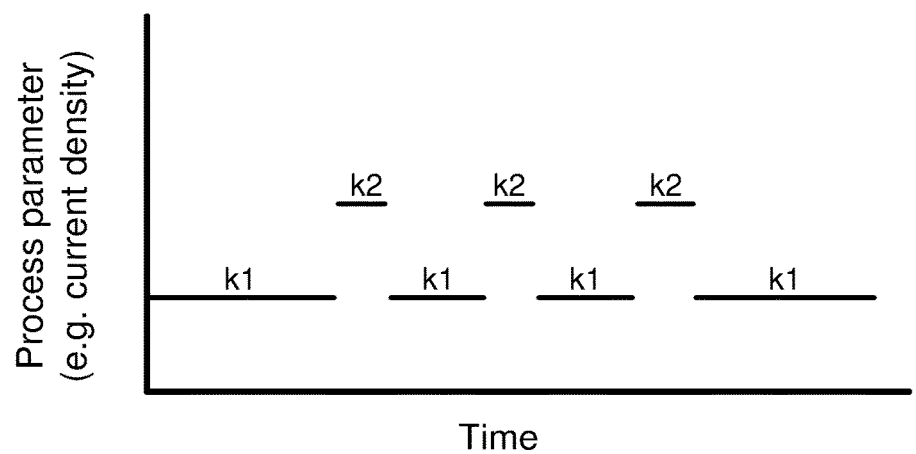

FIGS. 4F1-4F4 illustrate side views of example probe arrays or preform arrays including probes or preforms of the type shown in FIG. 4C wherein the arrays include different types of guide and/or mounting structures. FIG. 4F1 shows a plurality of example probes held in an array configuration by a permanent substrate that may or may not be a build substrate. FIG. 4F2 shows a plurality of example probes held in an array configuration by a combination of a permanent substrate and a guide plate. FIG. 4F3 shows example probes held in an array configuration by a plurality of guide plates. FIG. 4F4 shows example probes that have been shaped by relative lateral movement of the two guide plates of FIG. 4F3.

In the embodiment of FIGS. 4A-4F4, the probes have a shape based on use of multi-photon lithography to provide patterning of a photoresist which may be developed to provide openings of desired configurations for receiving deposited structural material to provide probes of desired configurations (e.g. fixed or varying cross-sectional widths, curvatures, bends, and the like). First a photoresist is applied (FIG. 4A), next the photoresist is patterned by multi-photon lithography (FIG. 4B). Once the photoresist is patterned and developed, deposition of structural metal (alone or in conjunction with co-deposition of other materials such as ceramics, nano-fibers, and the like) occurs wherein as plating progresses from bottom to top within the openings in the photoresist, the plating parameters may be varied to cause plated structural material to have different properties along the probe length (FIG. 4C). The variations in plating parameters, if they exist, may for example take a form similar one or more of those noted in association with FIG. 2A.

Figure 6:
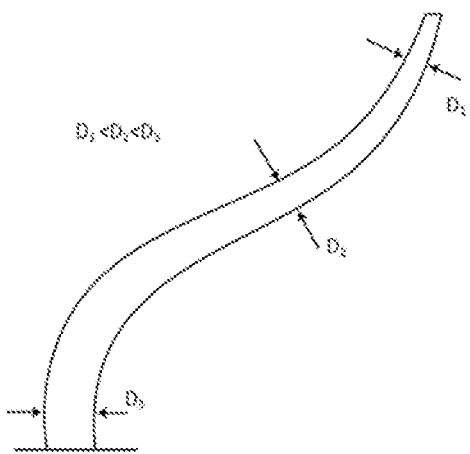
FIG. 6 provides an illustration of how multiphoton lithography can be used to provide a local variation in material shape (of a plating template) that can in turn be used to produce complex probe configurations (e.g. probes that have a continuous variations in a local diameter of a probe, probe preform, or other structure in a vertical build direction).

In other alternative embodiments, in addition to multi-photon patterning, deformation based patterning, more traditional lithography, laser machining, and/or the like may also be used particularly when the complexity of probe configurations or overlap in adjacent probe deposition regions prohibits effective multi-photon exposure to completely provide a desired level of patterning. In some variations, the multi-photon patterning of openings may provide not only desired curvature to the probes or differently oriented segments to the probes but also different cross-sectional widths to the probes at different heights as exemplified in FIG. 6.

As with the embodiment of FIGS. 2A-2F5 and 3A to 3F4, multiple variations of the embodiment of FIGS. 4A-4F4 are possible.

After the depositing of the structural material in the above examples, the photoresist or patterning material is generally removed to reveal the array of probes that has been formed.

In some variations, only a portion of the photoresist or patterning material may be removed as it may be desirable to use a portion of the photoresist or other patterning material as a permanent attachment support for the probes of the array, as a temporary support to the probes of the array until transfer of the probes to a permanent substrate is completed, or as a supplemental elastic enhancement to probes or as a barrier material against probe to probe shorting. In still other variations the patterning and deposition of structural material may not provide completed probes but only partially completed probes, or probe preforms, that may be subjected to additional processing to complete the formation of the probes (e.g., including the addition of tip material, addition dielectric barrier material, addition of a bonding material or bonding enhancement material. Further patterning of the probe preforms to set final probe configurations, e.g. by the methods of the U.S. patent application Ser. No. 17/384,680, entitled "Methods for Making Probe Arrays Utilizing Lateral Plastic Deformation of Probe Preforms", by Yaglioglu, filed on Jul. 23, 2021 or the methods of U.S. patent application Ser. No. 17/401,252, entitled "Probe Arrays and Improved Methods for Making and Using Longitudinal Deformation of Probe Preforms" by Lockard et al., filed Aug. 12, 2021). In still other embodiments, the probe arrays formed by the methods of FIGS. 2A-4F4 may require assembly to form full arrays prior to putting the combined arrays to use.

In some variations of the examples of FIGS. 2A-2C, the variation in probe material properties introduced in the probe may be periodic in nature or aperiodic. The introduction of material properties changes may be made to occur with particular geometric configurations of the probes (e.g. in straight regions, in selected curved regions, in regions of expanded or narrowed cross-sectional width, and the like). In still other variations of the embodiment of FIG. 2C, no variation in material properties may be necessary if the multi-photon lithography alone, or in combination with other patterning techniques, can provide desired probe attributes by geometric configuration variations alone.

In some embodiments, where multiphoton lithography is performed to provide local probe diameters that vary in cross-section, or even in more complex configurations (e.g. multi-beam probes) wherein the variations may form continuous or uniform transitions by controlling and smoothly varying the volume of the photon interplay that occurs by stair-step transitions.

The methods of the present invention may provide in-situ modulation of mechanical properties along the lengths of probes and, in particular, along the lengths of probes being formed while in array configurations. In situations where probes within an array have the same configurations, the in-situ process changes can result in the same mechanical property modulations on all of the probes at the same vertical (i.e. longitudinal heights) assuming uniform distribution of plating current and plating material density. In situations where some probes may have different cross-sectional configurations at different heights relative to other probes, it may be necessary to provide some plating inhibition for some openings or to provide modulated current density in different areas if property modulation is to remain at constant height levels throughout the lateral spread of the array. In other embodiments, where it is desirable to have different properties at different heights for some probes compared to other probes, masking techniques or modulated current densities, or other modulated plating parameters may be laterally controlled to provide such variation.

The methods of the present invention may be used to modulate a desired mechanical property within a certain range in continuous fashion (for example, the elastic modulus may be modulated from between, for example, 50-300 GPa, e.g. 85-210 GPa for Nickel). Properties to be varied may include young's modulus, yield strength, modulus of resilience, electrical resistance, or other properties.

Some beneficial results of the property modulation techniques set forth herein may include, for example: (1) regardless of how the probes are initially formed (straight probes, shaped probes by multiphoton lithography, deformed template, and/or by plastic deformation), by introducing "weaker" or "softer" sections along the height of the probe, certain deformed shapes under a certain force can be tailored to enable: (a) alternative tip "rocking" motion for desired contact scrub motion, and thereby enabling improved contact performance at a given contact force (e.g. less contact resistance), (b) modification of scrub length (e.g. to shorten it) by reducing the lateral motion force during a given overtravel, and/or (c) by forcing preferential deformation at certain segments along the length of a given probe, high stress and failure prone sections of a probe may be avoided which could be accomplished, for example by: (i) modulating the elastic properties along the height of a probe, (ii) modulating the cross section of a probe, or (iii) a combination of the two.

Variations of the above embodiments are possible. In some such variations, single structures or multiple structures with different configurations may be formed (e.g., formation of multiple probes that are not in an array configuration). In some embodiments, the deposited material may be planarized alone or in combination with the photoresist while in other embodiments, the photoresist may be replaced with a different material (e.g. a sacrificial material) prior to such planarization occurring. In other embodiments, planarization need not occur.

In other alternatives, a single deposition of material made with varying parameters may form only a portion of a structure as opposed to forming it from bottom to top while additional depositions, with or without additional plating templates, may be used to form additional portions of a structure. In such alternatives, additional portions of the structure may be added or attached to the initial layer in any appropriate manner. For example, one or more additional portions of the structure may be formed by forming one or more additional layers on the already formed layer. The formation of the additional layers may involve the use of the same or different structural materials, repeated use of the same cross-sectional configuration or different cross-sectional configurations, use of the same formation process or use of different formation processes. In some embodiments, dielectrics may form part of the structures. In some embodiments, metal deposition may occur by a process other than electrodeposition (e.g. electroless deposition, vacuum or vapor deposition, and the like).

In some alternatives, the photoresist may be replaced with a different material prior to depositing structural material. In some alternatives, the structure(s) may be formed on a permanent substrate (i.e. a substrate that will be included in the final product, e.g. a space transformer) or on a temporary substrate with a sacrificial layer or release layer or simply on a sacrificial substrate. In some alternatives, the initial layer as illustrated might actually be something other than a first layer. In some variations, one dimensional array may be provided, such as 1×N arrays, or two-dimensional arrays may be provided, such as N×M arrays.

The techniques used herein may also be used to set preferential bending locations when final probe configuration is to be set by lateral or longitudinal plastic deformation of deposited probe material.

Numerous variations of the methods taught here are possible and will be apparent to those of skill in the art upon review of the teachings herein. In some embodiment variations, the regions to which different plating parameters are applied may be limited to different portions of the compliant or spring regions of the probes while in other embodiment variations, different plating parameters may be applied to other portions of the probes.

Further Comments and Conclusions

Various other embodiments of the present invention exist. Some of these embodiments may be based on a combination of the teachings herein with various teachings incorporated herein by reference. For example, some other embodiments, or embodiment variations may be derived, mutatis mutandis, from the generalized embodiments, specific embodiments, and alternatives set forth in previously referenced U.S. Provisional Patent Application No. 63/015,450 by Lockard, et al. and U.S. Provisional Patent Application No. 63/055,892 by Yaglioglu.

For example, the guide plate to probe alignment and engagement methods of the '450 application may be used in aligning and engaging the deformation plates of the present invention. As another example, the guide plates of the '450 application that cause elastic deformation could function as deformation plates as taught in the present application wherein the plates may or may not be retained as guide plates (where any guide plate functionality may be used with or without implementing some additional amount of elastic or biased bending as taught in the '450 application). As another example, the deformation plates and variations associated with the embodiments of the '892 application may be used in variations of the embodiments of the present application, mutatis mutandis.

Some fabrication embodiments may not use any blanket deposition process. Some embodiments may use selective deposition processes or blanket deposition processes on some layers that are not electrodeposition processes. Some embodiments may use nickel or nickel-cobalt as a structural material while other embodiments may use different materials. For example, preferred spring materials include nickel (Ni), copper (Cu), beryllium copper (BeCu), nickel phosphorous (Ni—P), tungsten (W), aluminum copper (Al—Cu), steel, P7 alloy, palladium, palladium-cobalt, silver, molybdenum, manganese, brass, chrome, chromium copper (Cr—Cu), and combinations of these. Some embodiments may use copper as the structural material with or without a sacrificial material. Some embodiments, for example, may use nickel, nickel-phosphorous, nickel-cobalt, palladium, palladium-cobalt, gold, copper, tin, silver, zinc, solder, rhodium, rhenium as structural materials while other embodiments may use different materials. Some embodiments, for example, may use copper, tin, zinc, solder or other materials as sacrificial materials. Some embodiments may use different structural materials on different layers or on different portions of single layers. Some embodiments may remove a sacrificial material while other embodiments may not. Some embodiments may use photoresist, polyimide, glass, ceramics, other polymers, and the like as dielectric structural materials.

Structural or sacrificial dielectric materials may be incorporated into embodiments of the present invention in a variety of different ways. Such materials may form a third material or higher deposited material on selected layers or may form one of the first two materials deposited on some layers. Additional teachings concerning the formation of structures on dielectric substrates and/or the formation of structures that incorporate dielectric materials into the formation process and possibly into the final structures as formed are set forth in a number of patent applications filed Dec. 31, 2003: (1) U.S. Patent Application No. 60/534,184, which is entitled "Electrochemical Fabrication Methods Incorporating Dielectric Materials and/or Using Dielectric Substrates"; (2) U.S. Patent Application No. 60/533,932, which is entitled "Electrochemical Fabrication Methods Using Dielectric Substrates"; (3) U.S. Patent Application No. 60/534,157, which is entitled "Electrochemical Fabrication Methods Incorporating Dielectric Materials"; (4) U.S. Patent Application No. 60/533,891, which is entitled "Methods for Electrochemically Fabricating Structures Incorporating Dielectric Sheets and/or Seed layers That Are Partially Removed Via Planarization"; and (5) U.S. Patent Application No. 60/533,895, which is entitled "Electrochemical Fabrication Method for Producing Multi-layer Three-Dimensional Structures on a Porous Dielectric". These patent filings are each hereby incorporated herein by reference as if set forth in full herein.

Additional patent filings that provide, intra alia, teachings concerning incorporation of dielectrics into electrochemical fabrication processes include (1) U.S. patent application Ser. No. 11/139,262, filed May 26, 2005, now U.S. Pat. No. 7,501,328, by Lockard, et al., and which is entitled "Methods for Electrochemically Fabricating Structures Using Adhered Masks, Incorporating Dielectric Sheets, and/or Seed Layers that are Partially Removed Via Planarization"; (2) U.S. patent application Ser. No. 11/029,216, filed Jan. 3, 2005 by Cohen, et al., now abandoned, and which is entitled "Electrochemical Fabrication Methods Incorporating Dielectric Materials and/or Using Dielectric Substrates"; (3) U.S. patent application Ser. No. 11/028,957, by Cohen, which was filed on Jan. 3, 2005, now abandoned, and which is entitled "Incorporating Dielectric Materials and/or Using Dielectric Substrates"; (4) U.S. patent application Ser. No. 10/841,300, by Lockard et al., which was filed on May 7, 2004, now abandoned, and which is entitled "Methods for Electrochemically Fabricating Structures Using Adhered Masks, Incorporating Dielectric Sheets, and/or Seed Layers that are Partially Removed Via Planarization"; (5) U.S. patent application Ser. No. 10/841,378, by Lembrikov et al., which was filed on May 7, 2004, now U.S. Pat. No. 7,527,721, and which is entitled "Electrochemical Fabrication Method for Producing Multi-layer Three-Dimensional Structures on a Porous Dielectric; (6) U.S. patent application Ser. No. 11/325,405, filed Jan. 3, 2006 by Dennis R. Smalley, now abandoned, and entitled "Method of Forming Electrically Isolated Structures Using Thin Dielectric Coatings"; (7) U.S. patent application Ser. No. 10/607,931, by Brown, et al., which was filed on Jun. 27, 2003, now U.S. Pat. No. 7,239,219, and which is entitled "Miniature RF and Microwave Components and Methods for Fabricating Such Components", (8) U.S. patent application Ser. No. 10/841,006, by Thompson, et al., which was filed on May 7, 2004, now abandoned, and which is entitled "Electrochemically Fabricated Structures Having Dielectric or Active Bases and Methods of and Apparatus for Producing Such Structures"; (9) U.S. patent application Ser. No. 10/434,295, by Cohen, which was filed on May 7, 2003, now abandoned, and which is entitled "Method of and Apparatus for Forming Three-Dimensional Structures Integral With Semiconductor Based Circuitry"; and (10) U.S. patent application Ser. No. 10/677,556, by Cohen, et al., filed Oct. 1, 2003, now abandoned, and which is entitled "Monolithic Structures Including Alignment and/or Retention Fixtures for Accepting Components". These patent filings are each hereby incorporated herein by reference as if set forth in full herein.

Some embodiments may employ diffusion bonding or the like to enhance adhesion between successive layers of material. Various teachings concerning the use of diffusion bonding in electrochemical fabrication processes are set forth in U.S. patent application Ser. No. 10/841,382, which was filed May 7, 2004 by Cohen et al., now abandoned, which is entitled "Method of Electrochemically Fabricating Multilayer Structures Having Improved Interlayer Adhesion" and which is hereby incorporated herein by reference as if set forth in full. This application is hereby incorporated herein by reference as if set forth in full.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, enhanced methods of using may be implemented, and the like.

| U.S. patent application No., Filing Date U.S. application Pub No., Pub Date U.S. patent No., Pub Date | First Named Inventor, Title |
| --- | --- |
| 10/271,574-Oct. 15, 2002 2003-0127336-Jul. 10, 2003 7,288,178-Oct. 30, 2007 | Cohen, "Methods of and Apparatus for Making High Aspect Ratio Microelectromechanical Structures" |
| 10/387,958-Mar. 14, 2003 2003-022168-Dec. 4, 2003 — | Cohen, "Electrochemical Fabrication Method and Application for Producing Three-Dimensional Structures Having Improved Surface Finish" |
| 10/434,289-May 7, 2003 2004-0065555-Apr. 8, 2004 — | Zhang, "Conformable Contact Masking Methods and Apparatus Utilizing In Situ Cathodic Activation of a Substrate" |
| 10/434,294-May 7, 2003 2004-0065550-Apr. 8, 2004 — | Zhang, "Electrochemical Fabrication Methods With Enhanced Post Deposition Processing" |
| 10/434,315-May 7, 2003 2003-0234179-Dec. 25, 2003 7,229,542-Jun. 12, 2007 | Bang, "Methods of and Apparatus for Molding Structures Using Sacrificial Metal Patterns" |
| 10/434,494-May 7, 2003 2004-0000489-Jan. 1, 2004 — | Zhang, "Methods and Apparatus for Monitoring Deposition Quality During Conformable Contact Mask Plating Operations" |
| 10/677,498-Oct. 1, 2003 2004-0134788-Jul. 15, 2004 7,235,166-Jun. 26, 2007 | Cohen, "Multi-cell Masks and Methods and Apparatus for Using Such Masks To Form Three-Dimensional Structures" |
| 10/697,597-Oct. 29, 2003 2004-0146650-Jul. 29, 2004 — | Lockard, "EFAB Methods and Apparatus Including Spray Metal or Powder Coating Processes" |
| 10/724,513-Nov. 26, 2003 2004-0147124-Jul. 29, 2004 7,368,044-May 6, 2008 | Cohen, "Non-Conformable Masks and Methods and Apparatus for Forming Three-Dimensional Structures" |
| 10/724,515-Nov. 26, 2003 2004-0182716-Sep. 23, 2004 7,291,254-Nov. 6, 2007 | Cohen, "Method for Electrochemically Forming Structures Including Non-Parallel Mating of Contact Masks and Substrates" |
| 10/830,262-Apr. 21, 2004 2004-0251142-Dec. 16, 2004 7,198,704-Apr. 3, 2007 | Cohen, "Methods of Reducing Interlayer Discontinuities in Electrochemically Fabricated Three-Dimensional Structures" |
| 10/841,100-May 7, 2004 2005-0032362-Feb. 10, 2005 7,109,118-Sep. 19, 2006 | Cohen, "Electrochemical Fabrication Methods Including Use of Surface Treatments to Reduce Overplating and/or Planarization During Formation of Multi-layer Three-Dimensional Structures" |
| 10/841,347-May 7, 2004 2005-0072681-Apr. 7, 2005 — | Cohen, "Multi-step Release Method for Electrochemically Fabricated Structures" |
| 10/949,744-Sep. 24, 2004 2005-0126916-Jun. 16, 2005 7,498,714-Mar. 3, 2009 | Lockard, "Multi-Layer Three-Dimensional Structures Having Features Smaller Than a Minimum Feature Size Associated with the Formation of Individual Layers" |
| 12/345,624-Dec. 29, 2008 — 8,070,931-Dec. 6, 2011 | Cohen, "Electrochemical Fabrication Method Including Elastic Joining of Structures" |
| 14/194,564-Feb. 28, 2014 2014-0238865-Aug. 28, 2014 9,540,233-Jan. 10, 2017 | Kumar, "Methods of Forming Three-Dimensional Structures Having Reduced Stress and/or Curvature" |
| 14/720,719-May 22, 2015 — 9,878,401-Jan. 30, 2018 | Veeramani, "Methods of Forming Parts Using Laser Machining" |
| 14/872,033-Sep. 30, 2015 — — | Le, "Multi-Layer, Multi-Material Microscale and Millimeter Scale Batch Part Fabrication Methods Including Disambiguation of Good Parts and Defective Parts" |

It will be understood by those of skill in the art that additional operations may be used in variations of the above presented method of making embodiments. These additional operations may, for example, perform cleaning functions (e.g. between the primary operations discussed herein or discussed in the various materials incorporated herein by reference, they may perform activation functions and monitoring functions, and the like.

It will also be understood that the probe elements of some aspects of the invention may be formed with processes which are very different from the processes set forth herein and it is not intended that structural aspects of the invention need to be formed by only those processes taught herein or by processes made obvious by those taught herein.

Though various portions of this specification have been provided with headers, it is not intended that the headers be used to limit the application of teachings found in one portion of the specification from applying to other portions of the specification. For example, alternatives acknowledged in association with one embodiment, are intended to apply to all embodiments to the extent that the features of the different embodiments make such applications functional and do not otherwise contradict or remove all benefits of the adopted embodiment. Various other embodiments of the present invention exist. Some of these embodiments may be based on a combination of the teachings set forth herein with various teachings incorporated herein by reference.

It is intended that any aspects of the invention set forth herein represent independent invention descriptions which Applicant contemplates as full and complete invention descriptions that Applicant believes may be set forth as independent claims without need of importing additional limitations or elements, from other embodiments or aspects set forth herein, for interpretation or clarification other than when explicitly set forth in such independent claims once written. It is also understood that any variations of the aspects set forth herein represent individual and separate features that may form separate independent claims, be individually added to independent claims, or added as dependent claims to further define an invention being claimed by those respective dependent claims should they be written.

In view of the teachings herein, many further embodiments, alternatives in design and uses of the embodiments of the instant invention will be apparent to those of skill in the art. As such, it is not intended that the invention be limited to the particular illustrative embodiments, alternatives, and uses described above but instead that it be solely limited by the claims presented hereafter.

I claim:

1. A probe array, comprising:
   (a) a plurality of probes, comprising:
      (i) an elastically deformable body portion having a first end and a second end;
      (ii) a first contact region connected directly or indirectly to the first end, wherein the first contact region is configured for a function selected from a first group consisting of: (1) making temporary pressure based electrical contact to a first electronic component upon elastically biasing the deformable body with the first contact region against the first electronic component, and (2) bonding to the first electronic component for making permanent contact; and
      (iii) a second contact region connected directly or indirectly to the second end, wherein the second contact region is configured for making temporary pressure based electrical contact to a second electronic component upon elastically biasing the deformable body with the second contact region against the second electronic component,
   wherein multiple probes of the plurality of probes comprise at least one selected material located within at least two different portions along a length of each of the multiple probes wherein the at least one selected material at the at least two different portions has at least one different intrinsic material property including yield strength or elastic modulus; and
   (b) at least one probe array retention structure selected from a second group consisting of:
      (i) a substrate to which the first contact regions of the probes are bonded;
      (ii) a substrate to which the first contact regions of the probes are bonded along with at least one guide plate having a plurality of holes which engage the probes;
      (iii) a substrate to which the first contact regions of the probes are bonded along with at least one guide plate having a plurality of holes which engage the probes wherein the holes in at least one of the at least one guide plate are laterally shifted relative to the bonding locations on the substrate;
      (iv) a plurality of guide plates each having a plurality of holes which engage the probes;
      (v) a plurality of guide plates each having a plurality of holes which engage the probes, wherein at least two of the plurality of guide plates have holes that engage probes that are laterally aligned;
      (vi) a plurality of guide plates each having a plurality of holes which engage the probes, wherein at least two of the plurality of guide plates have holes that engage probes that are laterally shifted with respect to one another; and
      (vii) a retaining structure or alignment structure into which the probes are inserted wherein the retaining structure or alignment structure has thickness selected from a third group consisting of: (1) at least ¼ of a longitudinal length of the probes from first contact region to second contact region; (2) at least ½ of a longitudinal length of the probes from first contact region to second contact region; (3) at least ¾ of a longitudinal length of the probes from first contact region to second contact region.

2. The probe array of claim 1, wherein each of a plurality of the probes comprise a plurality of adhered layers.

3. The probe array of claim 1 wherein the first contact region of each of a plurality of probe is configured for bonding to the first electronic component for making permanent contact.

4. The probe array of claim 1 wherein the first contact region of each of a plurality of probes is configured for making temporary contact.

5. The probe array of claim 1 wherein the at least two different portions are separated by an amount selected from a fourth group consisting of: (1) at least 5 microns, (2) at least 10 microns, (3) at least 20 microns, (4) at least 50 microns, and (5) at least 100 microns.

6. The probe array of claim 5 wherein at least one different intrinsic material property is elastic modulus of the material wherein the difference between a first elastic modulus and a second elastic modulus having a value smaller than the first elastic modulus, is selected from a fifth group consisting of: (1) at least 10% of the second elastic modulus, (2) at least 20% of the second elastic modulus, (3) at least 40% of the second elastic modulus, (4) at least 70% of the second elastic modulus, (5) at least 100% of the second elastic modulus, and (6) at least 140% of the second elastic modulus.

7. The probe array of claim 1 wherein the at least two different portion form different parts of a compliant or spring portion of each probe.

8. The probe array of claim 7 wherein the at least two different portions are separated by an amount selected from a fourth group consisting of: (1) at least 5 microns, (2) at least 10 microns, (3) at least 20 microns, (4) at least 50 microns, and (5) at least 100 microns.

9. The probe array of claim 8 wherein at least one different intrinsic material property is elastic modulus of the material wherein the difference between a first elastic modulus and a second elastic modulus having a value smaller than the first elastic modulus is selected from a fifth group consisting of: (1) at least 10% of the second elastic modulus, (2) at least 20% of the second elastic modulus, (3) at least 40% of the second elastic modulus, (4) at least 70% of the second elastic modulus, (5) at least 100% of the second elastic modulus, and at least 140% of the second elastic modulus.

10. A method of forming a probe array, comprising:
    (a) forming a plurality of probes, comprising:
        (i) providing a build substrate;
        (ii) directly or indirectly on the substrate, providing at least one patterned template with a plurality of openings; and
        (iii) providing a structural material into the plurality of openings to form at least a portion of a plurality of probes, wherein the providing of the structural material comprises a method selected from a first group consisting of:
            (A) forming a plating template with a plurality of openings and then depositing a structural metal into the plurality of openings;
            (B) forming a plating template with a plurality of openings and then depositing a structural material wherein the deposition of the structural material comprises use of at least one different plating parameter values at at least two different heights along a length of the probes for a same structural material;
            (C) forming a plating template with a plurality of openings with the openings having lateral dimensions at different heights perpendicular to a plane of the template that are formed using multiphoton lithography; and
            (D) forming a plating template with a plurality of openings with the openings having lateral dimensions at different heights perpendicular to a plane of the template that are formed using multiphoton lithography and have varying lateral dimensions;
        wherein each of the plurality of probes comprise:
            (1) an elastically deformable body portion having a first end and a second end;
            (2) a first contact region connected directly or indirectly to the first end, wherein the first contact region is configured for a function selected from a second group consisting of: (1) making temporary pressure based electrical contact to a first electronic component upon elastically biasing the deformable body with the first contact region against the first electronic component, and (2) bonding to the first electronic component for making permanent contact; and
            (3) a second contact region connected directly or indirectly to the second end, wherein the second contact region is configured for making temporary pressure based electrical contact to a second electronic component upon elastically biasing the deformable body with the second contact region against the second electronic component, and
    (b) providing at least one probe array retention structure and configuring the probes and at least one retention structure according to a process selected from a third group consisting of:
        (i) providing a probe substrate to which the first contact regions of the probes are bonded, wherein the probe substrate comprises the build substrate;
        (ii) providing a probe substrate and bonding the first contact regions of the probes to the probe substrate wherein the probe substrate and the build substrate are different;
        (iii) providing a probe substrate to which the first contact regions of the probes are bonded wherein the probe substrate comprises the build substrate;
        (iv) providing a probe substrate and bonding the first contact regions of the probes to the probe substrate wherein the probe substrate and build substrate are different, and providing at least one guide plate having a plurality of holes that engage the probes;
        (v) providing a probe substrate and bonding the first contact regions of the probes to the probe substrate wherein the probe substrate and build substrate are different, and providing at least one guide plate having a plurality of holes and inserting the probes into the holes in the guide plate wherein holes in the guide plate are laterally aligned with bonding locations on the substrate;
        (vi) providing a probe substrate and bonding the first contact regions of the probes to the probe substrate wherein the probe substrate and build substrate are different, and providing at least one guide plate having a plurality of holes and inserting the probes into the holes in the guide plate, and laterally shifting the guide plate and the substrate so that holes in the guide plate are laterally shifted with respect to bonding locations on the substrate;
        (vii) providing a plurality of guide plates each having a plurality of holes which engage the probes;
        (viii) providing a plurality of guide plates each having a plurality of holes and engaging the probes with holes in at least one of the guide plates;
        (ix) providing a plurality of guide plates each having a plurality of holes which engage the probes, wherein at least two of the plurality of guide plates have holes that engage probes that are laterally aligned;
        (x) providing a plurality of guide plates each having a plurality of holes which engage the probes, wherein at least two of the plurality of guide plates have holes that engage probes that are laterally shifted with respect to one another;
        (xi) providing a plurality of guide plates each having a plurality of holes which engage the probes, and laterally shifting at least two of the plurality of guide plates respectively so that holes that engage probes in the at least two of the plurality of guide plates are laterally shifted with respect to one another;
        (xii) providing a plurality of guide plates each having a plurality of holes and engaging the probes with the holes in at least one of the guide plates, wherein at least two of the plurality of guide plates have holes that engage probes that are laterally shifted with respect to one another; and
        (xiii) providing a retaining structure or alignment structure into which the probes are inserted wherein the retaining structure or alignment structure has thickness selected from a fourth group consisting of: (1)

at least ¼ of a longitudinal length of the probes from first contact region to second contact region; (2) at least ½ of a longitudinal length of the probes from first contact region to second contact region; (3) at least ¾ of a longitudinal length of the probes from first contact region to second contact region.

11. The method of claim 10, comprising forming a plurality of adhered layers.

12. The method of claim 10 wherein the first contact region is configured for bonding to the first electronic component for making permanent contact.

13. The method of claim 10 wherein the first contact region is configured for making temporary contact.

14. The method of claim 10 wherein multiple probes of the plurality of probes comprise at least one selected material located within at least two different portions along a length of each of the multiple probes wherein the at least one selected material at the at least two different portions has at least one different intrinsic material property including yield strength or elastic modulus.

15. The method of claim 14 wherein at least one different intrinsic material property is elastic modulus of the material wherein the difference between a first elastic modulus and a second elastic modulus having a value smaller than the first elastic modulus is selected from a fifth group consisting of: (1) at least 10% of the second elastic modulus, (2) at least 20% of the second elastic modulus, (3) at least 40% of the second elastic modulus, (4) at least 70% of the second elastic modulus, (5) at least 100% of the second elastic modulus, and (6) at least 140% of the second elastic modulus.

16. The method of claim 12 wherein the at least two different portion form different parts of a compliant or spring portion of each probe.

17. The method of claim 16 wherein the at least two different portions are separated by an amount selected from a sixth group consisting of: (1) at least 5 microns, (2) at least 10 microns, (3) at least 20 microns, (4) at least 50 microns, and (5) at least 100 microns.

18. The method of claim 16 wherein at least one different intrinsic material property is elastic modulus of the material wherein the difference between a first elastic modulus and a second elastic modulus having a value smaller than the first elastic modulus is selected from a fifth group consisting of: (1) at least 10% of the second elastic modulus, (2) at least 20% of the second elastic modulus, (3) at least 40% of the second elastic modulus, (4) at least 70% of the second elastic modulus, (5) at least 100% of the second elastic modulus, and (6) at least 140% of the second elastic modulus.

* * * * *